(12) United States Patent
Lee et al.

(10) Patent No.: US 10,007,603 B2
(45) Date of Patent: Jun. 26, 2018

(54) NONVOLATILE MEMORY DEVICE AND OPERATING METHOD THEREOF FOR PERFORMING DUMPING OPERATIONS BETWEEN CACHE LATCH AND DATA LATCH OF PAGE BUFFERS DURING INPUT/OUTPUT OPERATIONS

(71) Applicants: Han-Jun Lee, Gunpo-si (KR); Dongku Kang, Seongnam-si (KR)

(72) Inventors: Han-Jun Lee, Gunpo-si (KR); Dongku Kang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 165 days.

(21) Appl. No.: 14/697,115

(22) Filed: Apr. 27, 2015

(65) Prior Publication Data

US 2015/0378887 A1 Dec. 31, 2015

(30) Foreign Application Priority Data

Jun. 25, 2014 (KR) ........................ 10-2014-0078197

(51) Int. Cl.
*G06F 12/02* (2006.01)
*G11C 16/10* (2006.01)
(Continued)

(52) U.S. Cl.
CPC ........ *G06F 12/0246* (2013.01); *G11C 7/1039* (2013.01); *G11C 16/10* (2013.01);
(Continued)

(58) Field of Classification Search
CPC ................ G06F 12/0246; G06F 13/16; G06F 2212/7208; G11C 16/28; G11C 7/1039; G11C 16/26; G11C 16/32; G11C 16/10
See application file for complete search history.

(56) References Cited

U.S. PATENT DOCUMENTS 7,706,184 B2   4/2010  Hamada
7,885,113 B2   2/2011  Ju
(Continued)

FOREIGN PATENT DOCUMENTS

JP    2013096751 A    5/2013
KR    20120005847 A   1/2012
(Continued)

*Primary Examiner* — Rocio Del Mar Perez-Velez
(74) *Attorney, Agent, or Firm* — Harness, Dickey & Pierce, P.L.C.

(57) ABSTRACT

A nonvolatile memory device includes a mat including a plurality of memory blocks, an address decoder configured to select one of the memory blocks in response to an address, an input/output circuit including first and second page buffers configured to program a plurality of data pages into a single physical page of the selected one of the memory blocks or store the plurality of data pages read from the single physical page of the selected one of the memory blocks, and a control logic configured to perform a dumping operation at an other one of the first page buffers and second page buffers when a data input operation or a data output operation is performed at one of the first and second page buffers of the input/output circuit. The input/output circuit includes a plurality of page buffers. The plurality of page buffers include the first and second page buffers.

8 Claims, 20 Drawing Sheets

(51) Int. Cl.
*G11C 7/10* (2006.01)
*G11C 16/26* (2006.01)
*G11C 16/32* (2006.01)
*G11C 16/28* (2006.01)

(52) U.S. Cl.
CPC .............. *G11C 16/26* (2013.01); *G11C 16/28* (2013.01); *G11C 16/32* (2013.01); *G06F 2212/7208* (2013.01)

(56) References Cited

U.S. PATENT DOCUMENTS

| | | | |
|---|---|---|---|
| 8,180,994 B2 | 5/2012 | Sprouse et al. | |
| 8,559,225 B2 | 10/2013 | Lee et al. | |
| 2006/0245247 A1* | 11/2006 | Yano | G11C 16/10 365/185.08 |
| 2007/0002624 A1* | 1/2007 | Ju | G11C 16/08 365/185.12 |
| 2007/0061538 A1* | 3/2007 | Chang | G06F 12/0882 711/169 |
| 2008/0162789 A1* | 7/2008 | Choi | G11C 11/5628 711/103 |
| 2009/0168527 A1 | 7/2009 | Hamada | |
| 2009/0285025 A1 | 11/2009 | Ju | |
| 2010/0329030 A1* | 12/2010 | You | G11C 16/10 365/185.22 |
| 2011/0010484 A1 | 1/2011 | Sprouse et al. | |
| 2011/0271041 A1* | 11/2011 | Lee | G06F 12/0246 711/103 |
| 2012/0203959 A1* | 8/2012 | Yoon | G06F 12/0246 711/103 |
| 2012/0331210 A1* | 12/2012 | Jeong | G11C 11/5642 711/103 |
| 2013/0013853 A1 | 1/2013 | Yeh | |
| 2013/0028025 A1 | 1/2013 | Lee et al. | |
| 2013/0103889 A1 | 4/2013 | Jeong | |
| 2013/0117620 A1* | 5/2013 | Joo | G11C 16/10 714/746 |
| 2013/0297987 A1* | 11/2013 | Gupta | G06F 11/1064 714/773 |

FOREIGN PATENT DOCUMENTS

| | | |
|---|---|---|
| KR | 20120119324 A | 10/2012 |
| KR | 20120140508 A | 12/2012 |

* cited by examiner

NONVOLATILE MEMORY DEVICE AND OPERATING METHOD THEREOF FOR PERFORMING DUMPING OPERATIONS BETWEEN CACHE LATCH AND DATA LATCH OF PAGE BUFFERS DURING INPUT/OUTPUT OPERATIONS

CROSS-REFERENCE TO RELATED APPLICATIONS

This U.S. non-provisional patent application claims priority under 35 USC § 119 to Korean Patent Application No. 10-2014-0078197, filed on Jun. 25, 2014, the disclosure of which is incorporated by reference in its entirety herein.

BACKGROUND

Technical Field

The present disclosure relates to a nonvolatile memory devices and, more particularly, to operating methods of nonvolatile memory devices.

Discussion of Related Art

In general, semiconductor memory devices are classified into volatile memory devices and nonvolatile memory devices. Volatile memory devices lose their stored data when their power supplies are interrupted. Volatile memory devices include a dynamic RAM (DRAM) and a static RAM (SRAM). Nonvolatile memory devices retain their stored data even when their power supplies are interrupted. Nonvolatile memory devices include a read only memory (ROM), a programmable ROM (PROM), an erasable PROM (EPROM), a phase change RAM (PRAM), a resistive RAM (RRAM), and a flash memory.

In recent years, nonvolatile memory devices have been developed as three-dimensional structures with improved integration density. Three-dimensional nonvolatile memory devices exhibit improved write speed, improved cell lifetime, and improved power efficiency. A three-dimensional nonvolatile memory device and a conventional two-dimensional nonvolatile memory device are structurally different from each other. Due to the structural differences between the three-dimensional and two-dimensional nonvolatile memory devices, various methods for driving three-dimensional nonvolatile memory devices have been studied.

SUMMARY

The present disclosure relates to nonvolatile memory devices and operating methods of the same.

Example embodiments of inventive concepts relate to an operating method of a nonvolatile memory device including first and second page buffers connected to a mat through a plurality of bitlines. The operating method may include performing a first input operation that includes externally inputting first sub-page data of first page data to at least one of the first page buffers; performing a second input operation that includes inputting second sub-page data of the first page data to at least one of the second page buffers after performing the first input operation; and performing a first dumping operation at the first page buffers during the second input operation.

In example embodiments, the operating method may further include performing a third input operation that includes inputting first sub-page data of second page data to the at least one of the first page buffers after performing the second input operation; performing a second dumping operation at the second page buffers during the third input operation; performing a fourth input operation that includes inputting second sub-page data of the second page data after performing the third input operation; and performing a third dumping operation at the at least one of the first page buffers during the fourth input operation.

In example embodiments, the operating method may further include performing a fifth input operation that includes inputting first sub-page data of third page data to the at least one of the first page buffers after performing the fourth input operation; performing a fourth dumping operation at the second page buffers during the fifth input operation; performing a sixth input operation that includes inputting second sub-page data of the third page data to the at least one of the second page buffers after performing the fifth input operation; and performing a fifth dumping operation at the at least one of the first page buffers during the sixth input operation.

In example embodiments, the operating method may further include performing a sixth dumping operation at the at least one of the second page buffers after performing the sixth input operation.

In example embodiments, the operating method may further include programming the first page data to the third page data into a single page of the memory cell array after completing the sixth dumping operation.

In example embodiments, the first to sixth input operations may be operations that include externally inputting the first page data to the third page data to cache latches of the at least one of the first page buffers and the at least one of the second page buffers.

In embodiments, the first to sixth dumping operation may be operations that include transmitting the first page to third page data to data latches from the cache latches of the at least one of the first page buffers and the at least one of the second page buffers.

Example embodiments of inventive concepts relate to an operating method of a nonvolatile memory device including first and second page buffers connected to a mat through a plurality of bitlines. The operating method may include sensing data included in a single page into the at least one of the first page buffers and at least one of the second page buffers, the data including first page data and second page data; performing a first output operation that includes outputting first sub-page data of the first page data from the at least one of the first page buffers during the sensing operation; performing a second output operation that includes outputting second sub-page data of the first page data from the at least one of the second page buffers after performing the first output operation; and performing a first dumping operation at the at least one of the first page buffers during the second output operation.

In example embodiments, the operating method may further include performing a third output operation that includes outputting first sub-page data of second page data from the at least one of the first page buffers after performing the first dumping operation; performing a second dumping operation at the at least one of the second page buffers during the third output operation; and performing a fourth output operation that includes outputting second sub-page data of the second page data from the at least one of the second page buffers after performing the second dumping operation.

In example embodiments, the data may further include third page data. the operating method may further include performing a third dumping operation at the at least one of the first page buffers during the fourth output operation; performing a fifth output operation that includes outputting first sub-page data of the third page data from the at least one of the first page buffers after performing the third dumping operation; performing a fourth dumping operation at the at least one of the second page buffers during the fifth output operation; and performing a sixth output operation that includes outputting second sub-page data of the third page data from the at least one of the second page buffers after the fourth dumping operation.

In example embodiments, the first to fourth dumping operations may be operations that include transmitting the first page to third page data to cache latches from data latches of the at least one of the first page buffers and at least one of the second page buffers.

In example embodiments, the first to sixth output operations may be operations that includes outputting the first page data to the third page data from the cache latches of the at least one of the first page buffers and at least one of the second page buffers to an external entity.

In example embodiments, a dumping operation of the at least one of the first page buffers and the at least one of the second page buffers may be performed during the sensing operation before performing the first and second output operations.

In example embodiment, the dumping operation may occur between cache latches and data latches included in the at least one of the first page buffers and at least one of the second page buffers.

Example embodiments of the disclosure relate to a non-volatile memory device. The nonvolatile memory device may include: a mat including a plurality of memory blocks; an address decoder configured to select one of the memory blocks in response to an address; an input/output circuit including a plurality of page buffers, the plurality of page buffers including first and second page buffers configured to program a plurality of data pages into a single physical page of the selected one of the memory blocks or store the plurality of data pages read from the single physical page of the selected one of the memory blocks; and a control logic configured to perform a dumping operation at an other one of the at least one of the first page buffers and the at least one of the second page buffers while a data input operation or a output operation is performed at one of the at least one of the first page buffers and the at least one of the second page buffers of the input/output circuit.

Example embodiments of inventive concepts relate to an operating method of a nonvolatile memory device including page buffers connected to a mat through a plurality of bitlines. The page buffers include first and second page buffers. The operating method may include performing Example embodiments of inventive concepts relate to an operating method of a nonvolatile memory device including first and second page buffers connected to a mat through a plurality of bitlines. The operating method may include performing a first transfer operation that includes transferring first sub-page data of first page data to at least one of the first page buffers; performing a second transfer operation that includes transferring second sub-page data of the first page data to at least one of the second page buffers after performing the first transfer operation; and performing a first dumping operation at the first page buffers during the second transfer operation.

In example embodiments, the page buffers may each include at least one cache latch and data latches. The first transfer operation may be a first input operation. The first input operation may include externally inputting the first sub-page data of the first page data into the at least one cache latch of the at least one of the first page buffers. The second transfer operation may a second input operation. The second input operation may include externally inputting the second sub-page data of the first page data into the at least one cache latch of the at least one of the second page buffers. The first dumping operation may include transmitting the first sub-page data of the first page data to at least one first data latch among the data latches in the at least one of the first page buffers.

In example embodiments, the operating method may further include: performing a third input operation that includes inputting first sub-page data of second page data to the at least one of the first page buffers after performing the second input operation; performing a second dumping operation at the at least one of the second page buffers during the third input operation; performing a fourth input operation that includes inputting second sub-page data of the second page data at the least one of the second page buffers after performing the third input operation; and performing a third dumping operation at the at least one of the first page buffers during the fourth input operation.

In example embodiments, the page buffers may each include at least one cache latch and data latches. The operating method may further include sensing data included in a single page into the at least one of the first page buffers and at least one of the second page buffers, before performing the first transfer operation. The data may include the first page data and the second page data. The first transfer operation may be a first output operation. The second transfer operation may be a second output operation. The first output operation may include outputting first sub-page data of the first page data from the at least one of the first page buffers during the sensing operation. The second output operation may include outputting second sub-page data of the first page data from the at least one of the second page buffers after performing the first output operation. The first dumping operation may include transmitting the first sub-page data of the first page data to the at least one cache latch in the at least one of the first page buffers.

In example embodiments, the operating method may further include performing a third output operation that includes outputting first sub-page data of second page data from the at least one of the first page buffers after performing the first dumping operation; performing a second dumping operation at the at least one of the second page buffers during the third output operation; and performing a fourth output operation that includes outputting second sub-page data of the second page data from the at least one the second page buffers after performing the second dumping operation.

In example embodiments, the method may further include performing a plurality of transfer operations, the plurality of transfer operations including the first transfer operation and the second transfer operation, the plurality of transfer operations including third to sixth transfer operations; performing a plurality of dumping operations, the plurality of dumping operations including the first dumping operation and second to fourth dumping operations; and one of programming data into a single physical page of the memory cell array after performing a fifth dumping operation and a sixth dumping operation of the plurality of dumping operations, or reading data from data from the single physical page of the memory cell array performing the fourth dumping operation.

BRIEF DESCRIPTION OF THE DRAWINGS

The foregoing and other features of example embodiments of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of example embodiments of inventive concepts. In the drawings.

DETAILED DESCRIPTION

Figure 1:
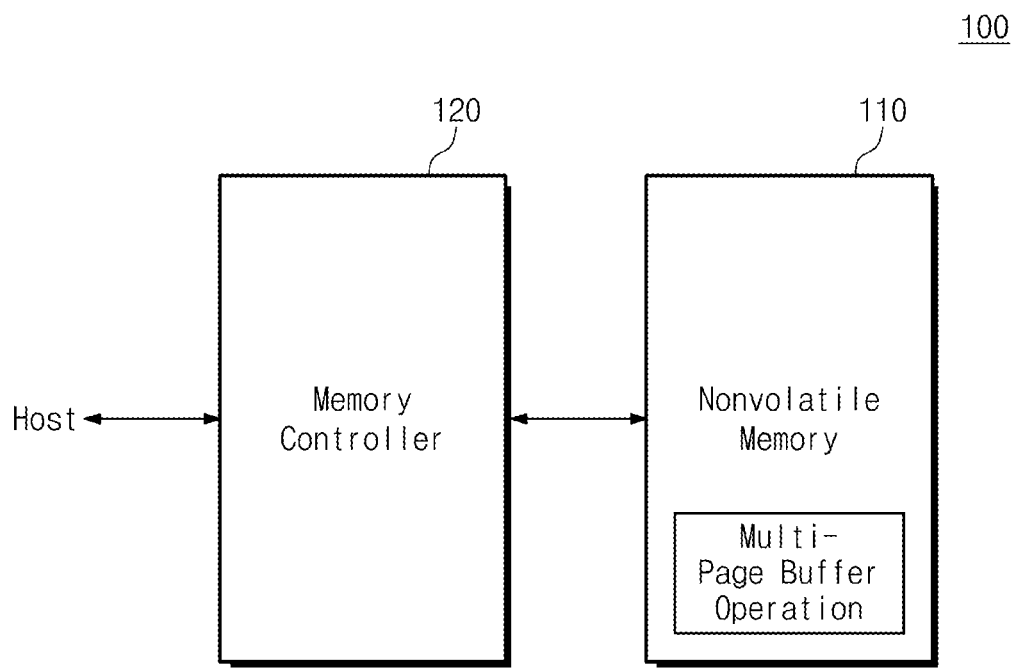
FIG. 1 is a block diagram of a storage device according to example embodiments of inventive concepts.

It should be understood that both the foregoing general description and the following the detailed description are given for the purpose of illustrating or describing features of example embodiments of inventive concepts and are made for more detailed explanation about features of example embodiments of inventive concepts recites in the claims. Reference numerals are shown in detail in example embodiments of inventive concepts, and their examples are shown in reference drawings. In any case possible, the same reference numbers will be used to refer to the same or like parts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of,"

when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, a memory system will be described as an example of a storage device or an electronic device for describing features and functions of example embodiments of inventive concepts. In addition, although features of inventive concepts will be described assuming under the assumption that a transmitted data unit is a sector unit, the data unit is not limited only to the sector unit. However, those skilled in the art will readily understand other advantages and functions of inventive concepts with the aid of the contents described herein. Furthermore, although a NAND flash memory will be explained as a storage medium, the storage medium may include other nonvolatile memory devices. For example, a PRAM, an MRAM, a ReRAM, an FRAM, and a NOR flash memory may be used as the storage medium and applied to a memory system in which different types of memory devices are used together.

FIG. 1 is a block diagram of a storage device 100 according to example embodiments of inventive concepts. As illustrated, the storage device 100 includes at least one nonvolatile memory device 110 and a memory controller 120.

The nonvolatile memory device 110 may be a NAND flash memory, a vertical NAND (VNAND) flash memory, a NOR flash memory, a resistive random access memory (RRAM), a phase-change memory (PRAM), a magneto resistive random access memory (MRAM), a ferroelectric random access memory (FRAM), a spin transfer torque random access memory (STT-RAM) or the like. The nonvolatile memory device 110 may be implemented with a three-dimensional array structure. Inventive concepts may be applied to not only a flash memory device in which a charge storage layer includes a conductive floating gate but also a charge trap flash (CTF) memory device in which a charge storage layer includes an insulating layer. Below, a case where the nonvolatile memory device 110 is a NAND flash memory is described, but example embodiments of inventive concepts are not limited thereto.

The nonvolatile memory device 110 may include a plurality of page buffers. The page buffers constitute a page buffer circuit. The page buffer circuit is connected to a single memory cell array and temporarily stores data to program the stored data into the memory cell or read the stored data. Thus, data received from the memory controller 120 may be stored in a single physical page of a mat through the page buffer circuit. In addition, data read from the mat may be output to the memory controller 120 through the page buffers.

A nonvolatile memory device according to inventive concepts may perform a multi-page buffer operation. The multi-page buffer operation means that a plurality of page buffers sequentially operate after being divided into a plurality of page buffers.

The memory controller 120 is connected to the nonvolatile memory device 110. The memory controller 120 is configured to access the nonvolatile memory device 110. For example, the memory controller 120 is configured to control read, write, erase, and background operations of the nonvolatile memory device 110. The memory controller 120 is configured to provide interfacing between the nonvolatile memory device 110 and a host.

Figure 2:
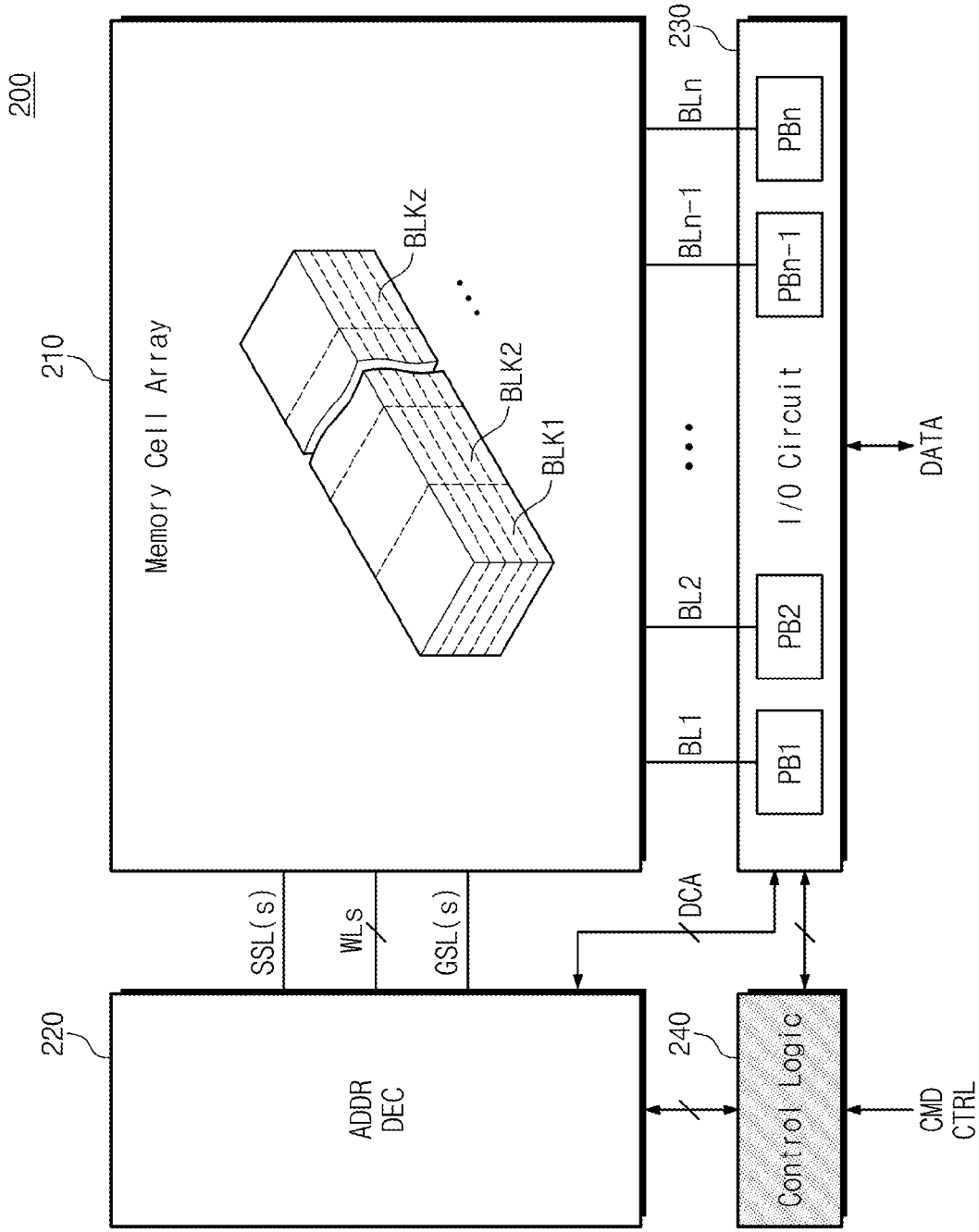
FIG. 2 is a block diagram of a nonvolatile memory device according to example embodiments of inventive concepts.

FIG. 2 is a block diagram of a nonvolatile memory device 200 according to example embodiments of inventive concepts. As illustrated, the nonvolatile memory device 200 includes a memory cell array 210, an address decoder 220, an input/output (I/O) circuit 230, and a control logic 240.

The memory cell array 210 may include a plurality of mats. Each of the mats may include a plurality of memory blocks BLK1 to BLKz (z being an integer equal to or greater than 2). Each of the mats is connected to the address decoder 220 through a plurality of string select lines SSL, wordlines WL, and ground select lines GSL. Each of the mats is connected to the I/O circuit 230 through a plurality of bitlines BL. The memory blocks BLK1 to BLKz may include a plurality of memory cells and a plurality of select transistors. The memory cells may be stacked on a substrate to form a three-dimensional structure. Each of the memory cells may store one or more bits.

The address decoder 220 is connected to the respective mats of the memory cell array 210 through a plurality of string select lines SSL, wordlines WLs, and ground select lines GSL. The address decoder 220 operates in response to a control signal of the control logic 240. The address decoder 220 externally receives an address ADDR.

The address decoder 220 may decode the received address ADDR. The address decoder 220 may control a voltage applied to the wordlines WLs according to the decoded address. More specifically, the address decoder 220 may apply a pass voltage to the wordlines WLs according to the control of the control logic 240 during a program operation. The address decoder 220 may further apply a voltage to at least one selected wordline indicated by the decoded address among the wordlines WLs during the program operation.

The I/O circuit 230 includes a plurality of page buffers PB1 to PBn (n being an integer equal to or greater than 2). Each of the page buffers PB1 to PBn shown in FIG. 2 may correspond to an all-bitline structure. The page buffers PB1 to PBn may correspond to an even-odd bitline structure. Each of the page buffers PB1 to PBn may include a plurality of latches. The latches may include a sense latch, a plurality of data latches, and a cache latch according to functions.

The page buffers PB1 to PBn are connected to a mat through a plurality of bitlines BL1 to BLn. The I/O circuit 230 may exchange data with an external entity. The I/O circuit 230 operates in response to a control signal of the control logic 240. The I/O circuit 230 receives a decoded column address DCA from the address decoder 220.

The I/O circuit 230 may select the bitlines BL1 to BLn using the decoded column address DCA. The I/O circuit 230 includes a plurality of page buffers PB1 to PBn. The page buffers PB1 to PBn may temporarily store data DATA. The I/O circuit 230 may include a page buffer driver. The page buffer driver manages input/output of the data DATA to the page buffers PB1 to PBn.

The I/O circuit 230 externally receives data DATA during a program operation. The I/O circuit 230 temporarily stores the received data DATA in the page buffers PB1 to PBn through the page buffer driver. The I/O circuit 230 applies the data DATA stored in the page buffers PB1 to PBn to the mat through a plurality of bitlines BL.

The I/O circuit 230 reads the data DATA from the mat and temporarily stores the read data in the page buffers PB1 to PBn during a read operation. The I/O circuit 230 transmits the data DATA stored in the page buffers PB1 to PBn to an external entity through the page buffer driver.

In some embodiments, the I/O circuit 230 may include a page buffer and a column select circuit. In other embodiments, the I/O circuit 230 may include a sense amplifier, a write driver, and a column select circuit. The column select circuit of the I/O circuit 230 may select the respective bitlines BL1 to BLn in response to a column address DCA.

The control logic 240 is connected to the address decoder 220 and the I/O circuit 230. The control logic 240 operates by a control signal CTRL and a command CMD that are externally applied. The control logic 240 may decode the command CMD and control the overall operation of the nonvolatile memory device 200 according to the decoded command CMD.

The control logic 240 may generate various control signals and voltages according to the received control signal CTRL. The control logic 240 may control the address decoder 220 to select a wordline and a bitline and control the I/O circuit 230 to temporarily store data of a selected memory cell in each of the corresponding page buffers PB1 to PBn.

The control logic 240 may perform a multi-page buffer operation. The control logic 240 control the page buffers PB1 to PBn to operate after they are divided. For example, let it be assumed that the control logic 240 control the page buffers PB1 to PBn to operate after they are divided into first and second page buffers. The control logic 240 controls sub-page data to be written into second page buffers while a dumping operation of another sub-page data is performed in first page buffers.

The control logic 240 controls sub-page data to be output in the second page buffers while a dumping operation of another sub-page data is performed in the first page buffers. The dumping operation occurs between caches latches and data latches included in the page buffers PB1 to PBn.

The nonvolatile memory device 200 in FIG. 1 is not limited to a single memory cell array 210 and a single I/O circuit 230. The nonvolatile memory device 200 may include a plurality of memory cell arrays and a plurality of I/O circuits. The control logic 240 may control the memory cell arrays and the I/O circuits to implement a multi-page buffer operation.

Figure 3:
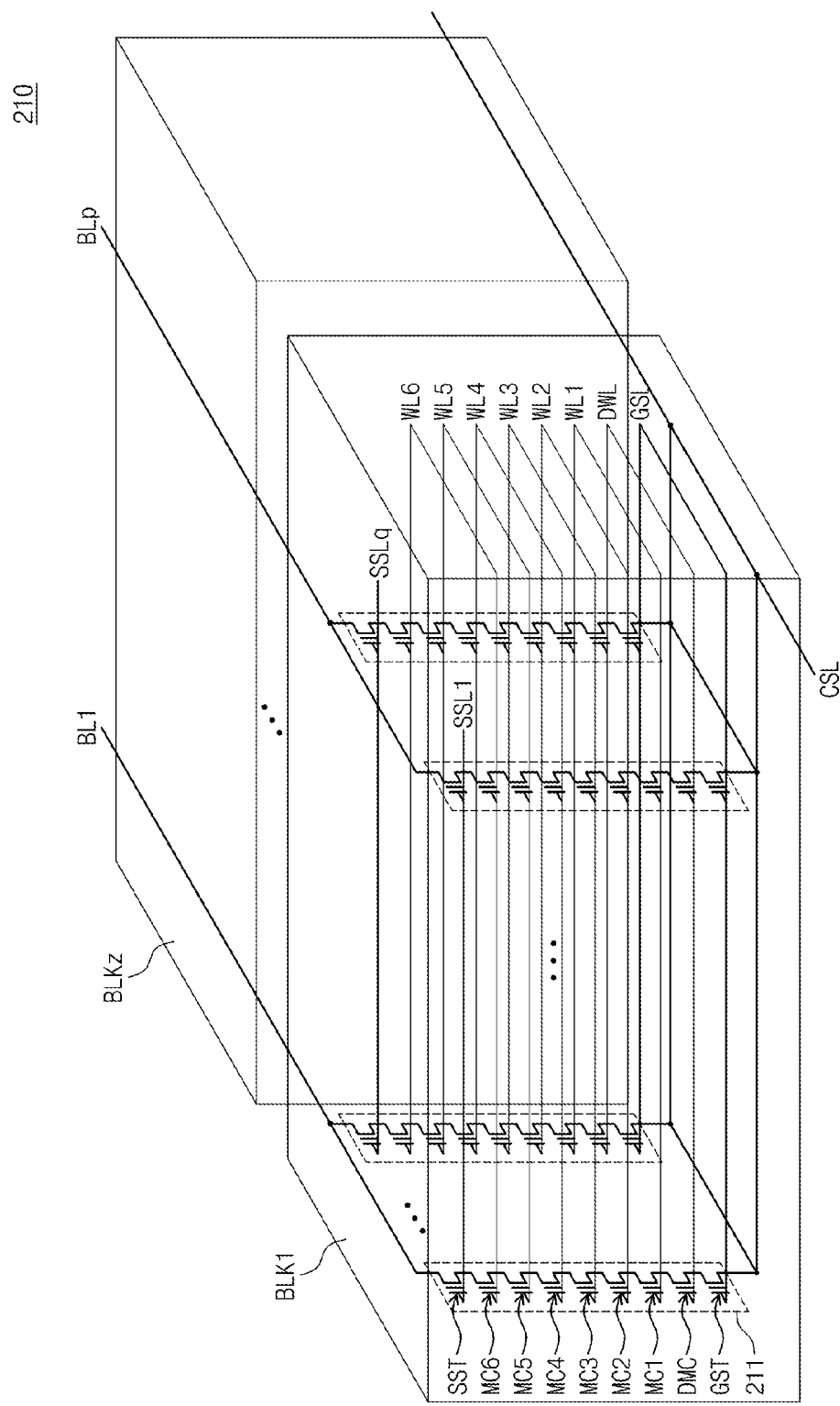
FIG. 3 is a circuit diagram of a memory cell array in FIG. 2.

FIG. 3 is a circuit diagram of the memory cell array 210 in FIG. 2. Referring to FIG. 3, the memory cell array 210 includes a plurality of mats. Each of the mats includes a plurality of memory blocks BLK1 to BLKz. For brevity of description, a circuit constituting the memory blocks BLK1 to BLKz will be described by focusing on a first memory block BLK1. Each of the other memory blocks BLK2 to BLKz may have the same configuration as the first memory block BLK1.

The first memory block BLK1 is connected to a plurality of bitlines BL1 to BLp (p being an integer equal to or greater than 2). The first memory block BLK1 is connected to a plurality of string select lines SSL1 to SSLq (q being an integer equal to or greater than 2), first to sixth wordlines WL1 to WL6, a dummy wordline DWL, a ground select line GSL, and a common source line CSL.

A single string select line SSL is connected to a gate of a string select transistor SST. The string select transistor SST is coupled between a single bitline and the sixth memory cell MC6.

The first to sixth memory cells MC1 to MC6 are connected in series and coupled between the string select transistor SST and a dummy memory cell DMC. Gate terminals of the first to sixth memory cells MC1 to MC6 are connected to first to sixth wordlines WL1 to WL6, respectively. A memory cell is not limited to the first to sixth memory cells MC1 to MC6.

The dummy memory cell DMC is coupled between the first memory cell MC1 and a ground select transistor GST. A gate terminal of the dummy memory cell DMC is connected to a dummy wordline DWL. The ground select transistor GST is coupled between the dummy memory cell DMC and the common source line CSL. A gate of the ground select transistor GST is connected to a ground select line GSL.

The ground select transistor GST, the dummy memory cell DMC, the first to sixth memory cells MC1 to MC6, and the string select transistor SST coupled between the single bitline BL1 and the common source line CSL are called a first string 211. A plurality of strings are connected to the bitlines BL1 to BLp, respectively. The configuration of the strings is identical to that of a first string 211.

A single string may include a greater number of memory cells than the six memory cells MC1 to MC6. A single string may include a smaller number of memory cells than the six memory cells MC1 to MC6. Instead of a memory cell, a plurality of dummy memory cells may be connected to the string select transistor SST. One or more dummy memory cells may be connected to the first memory cell MC1.

Each memory cell may store one bit of data, or a plurality of bits of data (e.g., 2 or more bits). A memory cell capable of storing one bit of data per cell is called a single-level cell (SLC) or a single-bit cell. A memory cell capable of storing two or more bits of data per cell is called a multi-level cell (MLC) or a multi-bit cell. In case of a 2-bit MLC, two-page data is stored in a single physical page. A memory cell capable of storing three or more bits of data per cell is called a triple-level cell (TLC) or a triple-bit cell. In case of a 3-bit TLC, three-page data is stored in a single physical page.

Let it be assumed that each memory cell of the memory cell array 210 is a triple-level cell (TLC).

Figure 4:
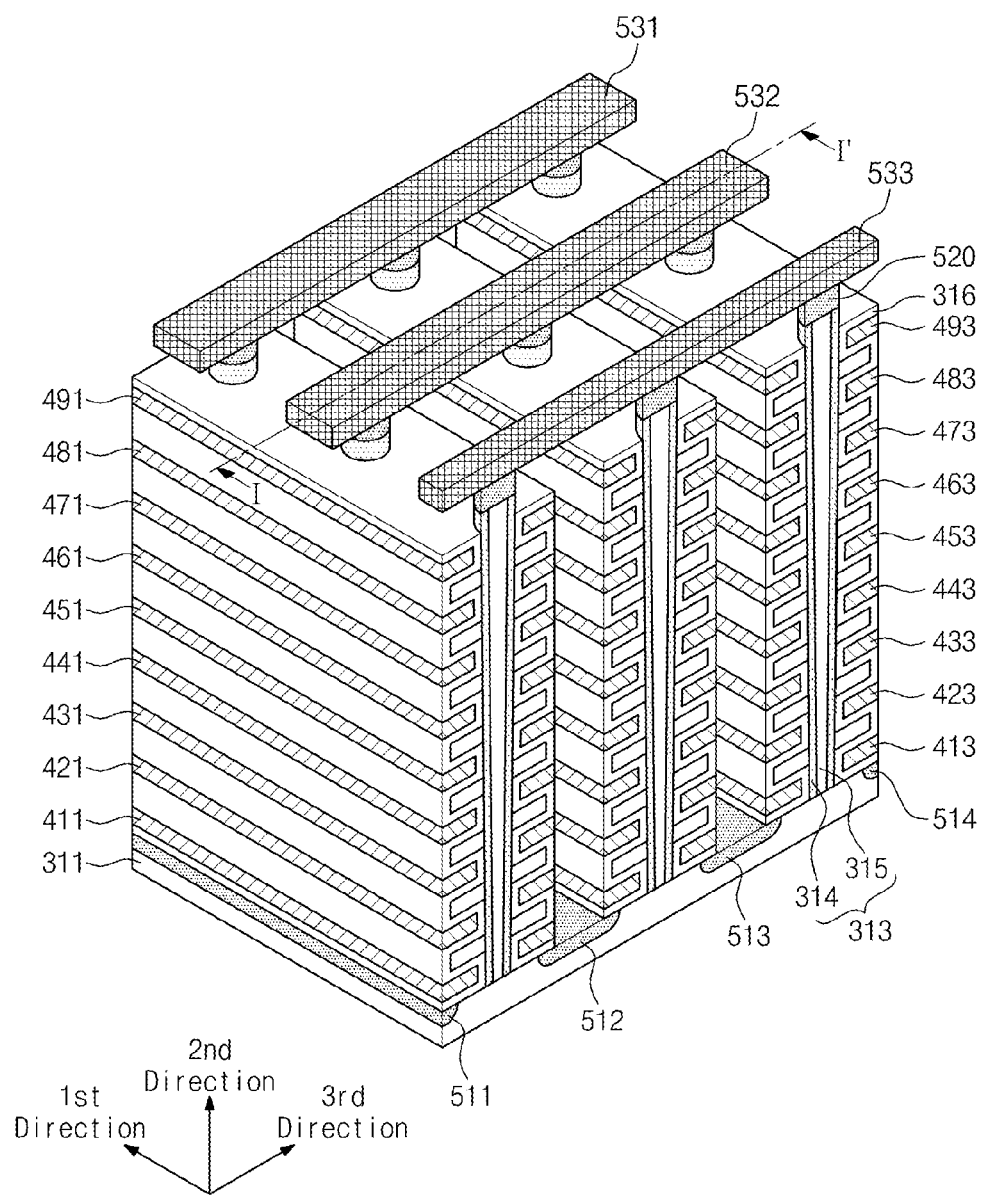
FIG. 4 is a perspective view showing a portion of a memory block in FIG. 3.
Figure 5:
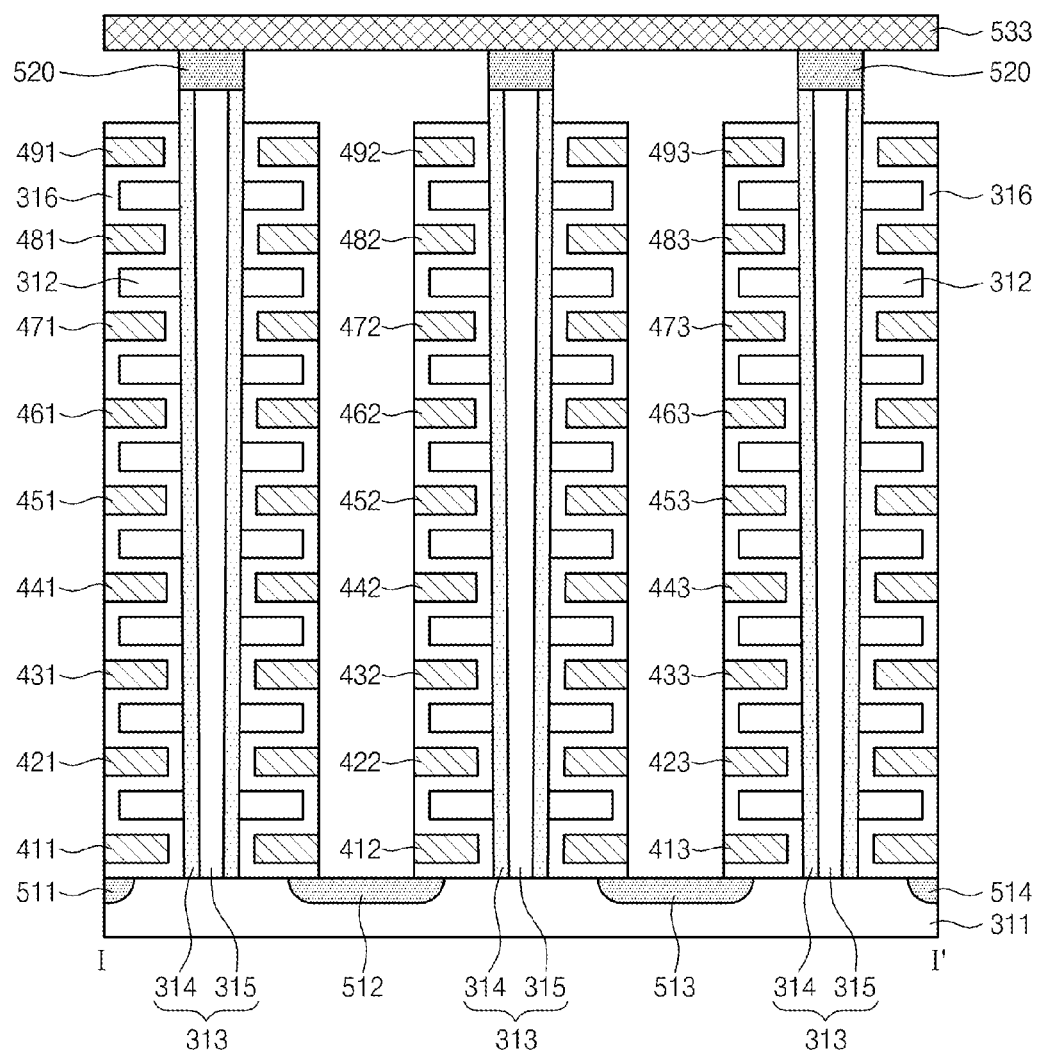
FIG. 5 is a cross-sectional view taken along the line V-V' in FIG. 4.

FIG. 4 is a perspective view showing a portion BLK1a of the memory block BLK1 in FIG. 3, and FIG. 5 is a cross-sectional view taken along the line V-V' in FIG. 4. Referring to FIGS. 4 and 5, the portion BLK1a of the first memory block BLK1 includes structures extending in first to third directions.

A substrate 311 is provided. The substrate 311 may be a well having a first type. For example, the substrate 311 may include a silicon material doped with p-type impurities. For example, the substrate 311 may be a p-well (or p-type pocket well). Hereinafter, let it be assumed that the substrate 311 is a p-type well (or p-type pocket well). However, the substrate 311 is not limited to p-type silicon.

A plurality of doped regions 511-514 extending in the first direction are provided on the substrate 311. For example, the doped regions 511-514 may have a second type different from that of the substrate 311. For example, the doped regions 511-514 may have an n-type. Hereinafter, let it be assumed that the doped regions 511-514 may have an n-type. However, the conductivity type of the doped regions 511-514 is not limited to the n-type.

On a region of the substrate 311 between the first and second doped regions 511 and 512, a plurality of insulating materials 312 extending in the first direction are sequentially provided in the second direction. For example, the insulating materials 312 are provided in the second direction to be spaced apart from each other at specific intervals. The insulating materials 312 may include an insulating material such as silicon oxide.

On the region of the substrate 311 between the first and second doped regions 511 and 512, a plurality of pillars 313 are provided which are sequentially disposed in the first direction and penetrate the insulating materials 312. In some embodiments, the pillars 313 may be in contact with the substrate 311 through the insulating materials 312.

In some embodiments, each of the pillars 313 may include a plurality of materials. For example, a surface layer 314 of each of the pillars 313 may include a silicon material having a first type. For example, a surface layer 314 of each of the pillars 313 may include a silicon material having the same type as the substrate 311. Hereinafter, let it be assumed that a surface layer 311 of each of the pillars 313 includes p-type silicon. However, the surface 314 of each of the pillars 313 is not limited to the p-type.

An inner layer 315 of each of the pillars 313 may include an insulating material. For example, the inner layer 315 of each of the pillars 313 may include an insulating material such as silicon oxide. For example, the inner layer 315 of each of the pillars 313 may include an air gap.

In the region between the first and second doped regions 511 and 512, an insulating layer 316 is provided along exposed surfaces of the insulating materials 312, the pillars 313, and the substrate 311. In some embodiments, an insulating layer 316 provided on an exposed surface in the second direction of the last insulating material 312 may be removed in the second direction.

In the region between the first and second doped regions 511 and 512, first conductive materials 411-491 are provided on an exposed surface of the insulating layer 316. For example, a first conductive material 411 extending in the first direction is provided between the substrate 311 and the insulating material 312 adjacent to the substrate 311. More specifically, a first conductive material 411 extending in the first direction is provided between the substrate 411 and an insulating layer 316 on a bottom surface of the insulating material 312 adjacent to the substrate 311.

A first conductive material extending in the first direction is provided between an insulating layer 316 of a specific material top surface among the insulating materials 312 and an insulating layer 316 of a bottom surface of an insulating layer disposed above a specific insulating material. In some embodiments, a plurality of first conductive materials 411-491 extending in the first direction are provided between the insulating materials 312. In some embodiments, the first conductive materials 411-491 may metal materials. In some embodiments, the first conductive materials 411-491 may be conductive materials such as polysilicon.

The same structure as that on the first and second doped regions 511 and 512 may be provided in a region between the second and third doped regions 512 and 513. In some embodiments, a plurality of insulating materials 312 extending in the first direction, a plurality of pillars 313 sequentially disposed in the first direction and penetrating the insulating materials 312 in the third direction, an insulating layer 316 provided on exposed surfaces of the insulating materials 312 and the pillars 313, and a plurality of first conductive materials 412-492 extending in the first direction are provided in the region between the second and third doped regions 512 and 513.

The same structure as that on the first and second doped regions 511 and 512 may be provided in a region between the third and fourth doped regions 513 and 514. In some embodiments, a plurality of insulating materials 312 extending in the first direction, a plurality of pillars 313 sequentially disposed in the first direction and penetrating the insulating materials 312 in the second direction, an insulating layer 316 provided on exposed surfaces of the insulating materials 312 and the pillars 313, and a plurality of first conductive materials 413-493 extending in the first direction are provided in the region between the third and fourth doped regions 513 and 514.

Drains 520 are provided on the pillars 313, respectively. In some embodiments, the drains 520 may include silicon materials doped with second-type impurities. For example, the drains 520 may include silicon materials doped with n-type impurities. However, the drains 520 are not limited to the n-type.

In some embodiments, width of each of the drains 520 may be greater than that of a corresponding pillar 313. For example, each of the drains 520 may be provided on a top surface of a corresponding pillar 312 in the form of a pad. In some embodiments, each of the drains 520 may extend to a portion of a corresponding surface layer 314.

Conductive materials 531-533 extending in a third direction are provided on the drains 520. The conductive materials 531-533 are disposed in the first direction to be spaced apart from each other at specific intervals. The conductive materials 531-533 are connected to the drains 520 in a corresponding region, respectively. In some embodiments, the drains 520 and the conductive material 533 extending in the third direction are connected through contact plugs, respectively. In some embodiments, the conductive materials 531-533 may metal materials. The conductive materials 531-533 may be conductive materials such as polysilicon.

Figure 6:
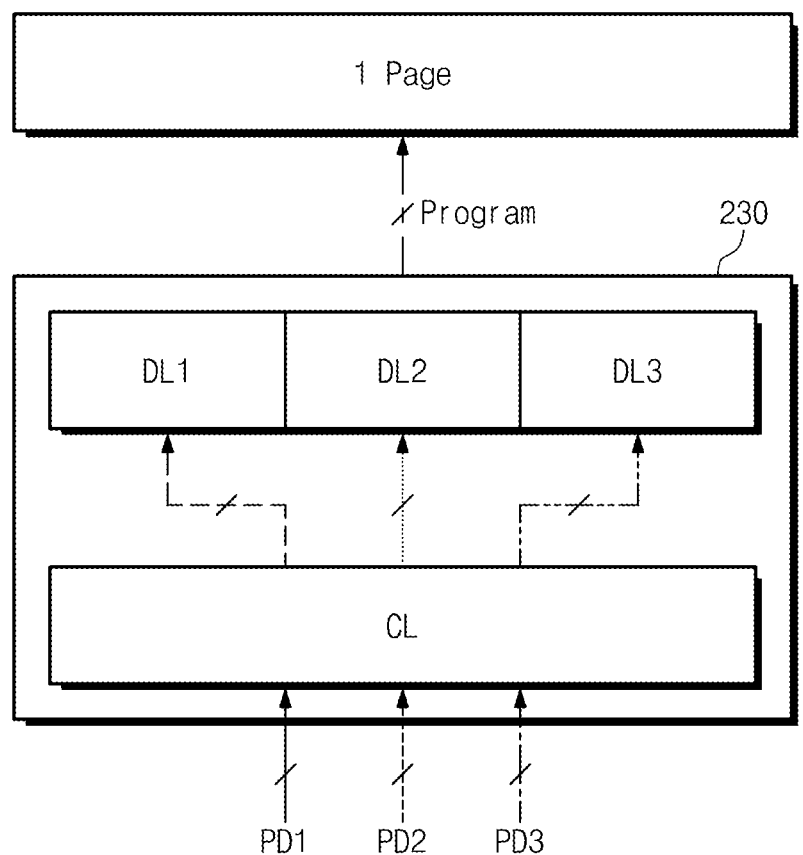
FIG. 6 is a block diagram illustrating a program operation of an input/output circuit of a nonvolatile memory device.

FIG. 6 is a block diagram illustrating a program operation of an input/output (I/O) circuit 230 of a nonvolatile memory device. Referring to FIG. 6, the I/O circuit 230 includes a plurality of page buffers PB1 to PBn. Each of the page buffers PB1 to PBn includes a cache latch CL and a data latch DL. Since the nonvolatile memory device according to inventive concepts includes a triple-level cell (TLC), each page buffer includes at least three data latches DL1 to DL3.

Cache latches CL may receive first page data PD1 during a program operation. The cache latches CL may receive second page data PD2 after transmitting the first page data PD1 to first data latches DL1. The cache latches CL may receive third page data PD3 after transmitting the second page data PD2 to second data latches DL2. The cache latches CL may receive the third page data PD3 and transmit the third page data PD to the third data latches DL3. The first page data PD1 stored in the first data latch DL1, the second page data PD2 stored in the second data latch DL2, and the third page data PD3 stored in the third data latch DL3 may be programmed into one page (1 Page) at a time. The one page (1 Page) is a single physical page.

The first page data PD1, the second page data PD2, and the third page data PD3 may be a least significant bit (LSB), a central significant bit (CSB), and a most significant bit (MSB), respectively. The first page data PD1 may be LSB page data. The second page data PD2 may be CSB page data. The third page data PD3 may be MSB page data.

Figure 7:
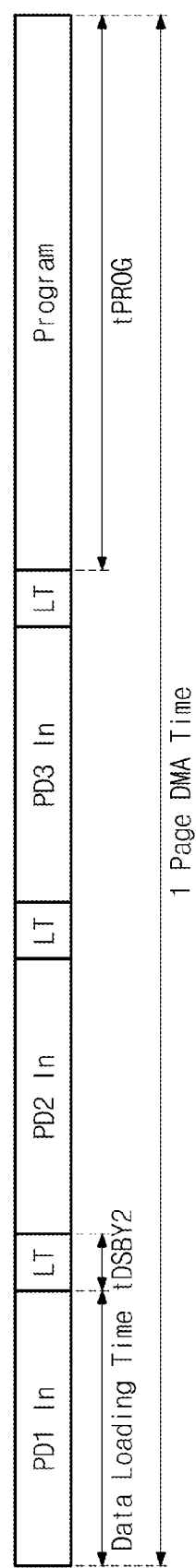
FIG. 7 is a conceptual diagram illustrating time for the program operation of the input/output circuit in FIG. 6.

FIG. 7 is a conceptual diagram illustrating time for the program operation of the I/O circuit 230 in FIG. 6. Referring to FIGS. 6 and 7, the cache latches CL receives first page data PD1 for data loading time. The cache latches CL dumps the first page data PD1 into the first data latches DL1 for dummy busy time tDSBY2.

After the dumping operation of the first page data PD1, the cache latches CL receives the second page data PD2 for data loading time. The cache latches CL dumps the second page data PD2 into the second data latches DL2 for dummy busy time tDSBY2.

After the dumping operation of the second page data PD2, the cache latches CL receives the third page data PD3 for data loading time. The cache latches CL dumps the third page data PD3 into the third data latches DL3 for dummy busy time tDSBY2.

After the dumping operation of the third page data PD2, the first page data PD1 to the third page data PD3 are programmed into a single physical page (1 Page) for program time tPROG.

Referring to FIG. 7, let it be assumed that each data loading time is 30 microseconds (us). In addition, let it be assumed that each dummy busy time tDSBY2 is 8 us. When the first page data PD1 to the third page data PD3 are input to the cache latches CL, a host is in a ready state. When the first page data PD1 to the third page data PD3 are dumped into the first data latch DL1 to the third data latch DL3, the memory cell array 210 (see FIG. 2) is in a busy state.

When the host is in a ready state, the memory cell array 210 is in the ready state. When the host is in a busy state, the memory cell array is also in the busy state. Thus, the host is affected by the busy state of the memory cell array 210.

The total time of the data loading time, the dummy busy time tDSBY2, and the program time tPROG of the first page data PD1 to the third page data PD3 is called one page program time (1 page DMA time).

Figure 8:
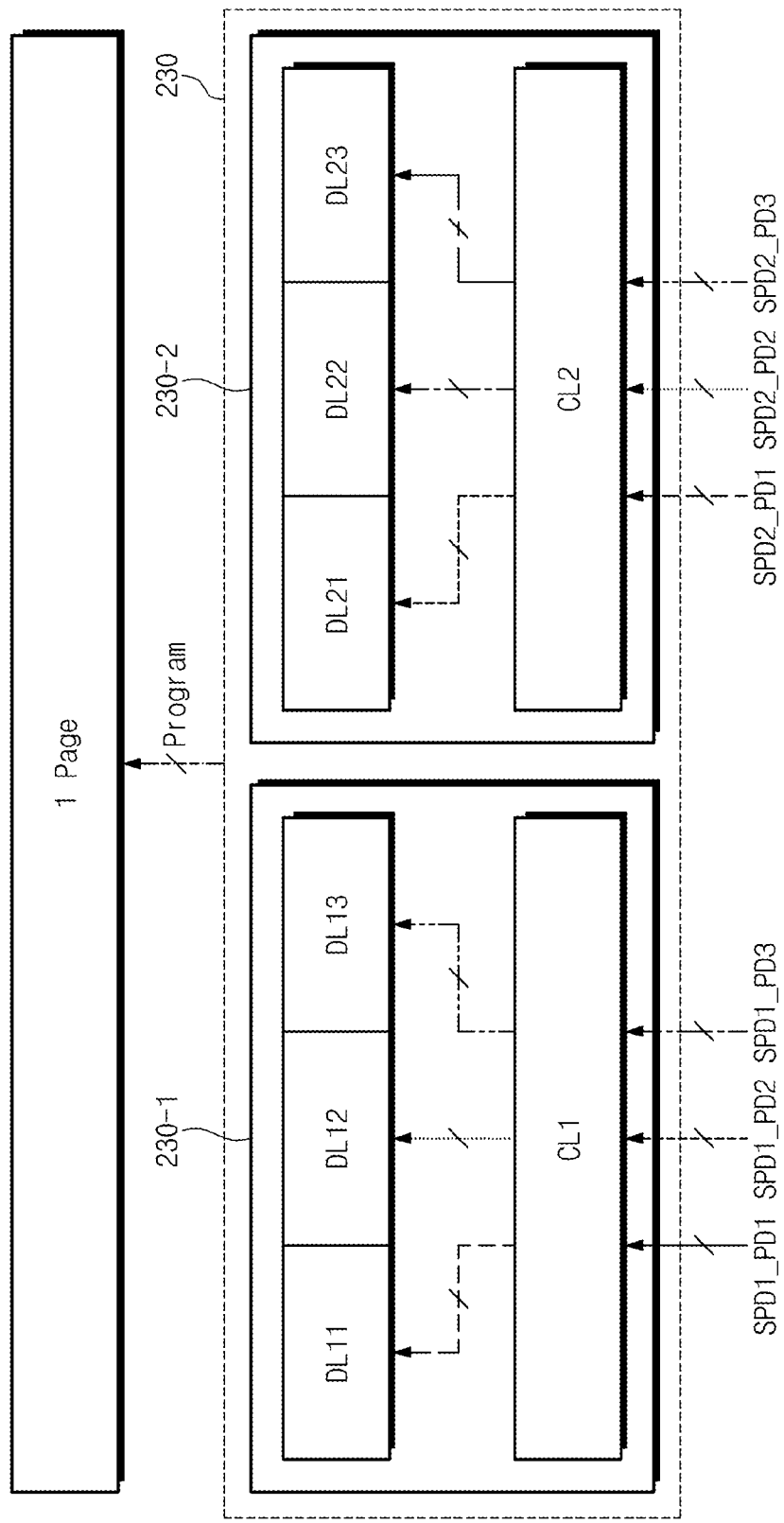
FIG. 8 is a block diagram illustrating a program operation of an input/output circuit according to example embodiments of inventive concepts.

FIG. 8 is a block diagram illustrating a program operation of an input/output (I/O) circuit 230 according to example embodiments of inventive concepts. Referring to FIG. 8, let it be assumed that page buffers of the I/O circuit 230 operate after being divided into first page buffers 230-1 and second page buffers 230-2. The division operation of the first and second page buffers 230-1 and 230-2 is performed by a control signal of the control logic 240 (see FIG. 2).

Each of the first page buffers 230-1 includes at least one cache latch CL1 and at least three data latches DL11 to DL13. Each of the second page buffers 230-2 includes at least one cache latch CL2 and at least three data latches DL21 to DL23.

During a program operation according to example embodiments of inventive concepts, a first sub-page data SD1_PD1 is input to the cache latch CL1 of the first page buffers 230-1. While the first sub-page data SPD1_PD1 is transmitted to the first data latches DL11 from the cache latches CL1, second sub-page data SPD2_PD1 of first page data is input to the cache latches CL2 of the second page buffers 230-2.

While the second sub-page data SPD2_PD1 is transmitted to the first data latches DL21 from the cache latches CL2, first sub-page data SPD1_PD2 of second page data is input to the cache latches CL1 of the first page buffers 230-1. While the first sub-page data SPD1_PD2 is transmitted to the second data latches DL12 from the cache latches CL1, second sub-page data SPD2_PD2 of the second page data is input to the cache latches CL2 of the second page buffers 230-2.

While the second sub-page data SPD2_PD2 is transmitted to the second data latches DL22 from the cache latches CL2, first sub-page data SPD1_PD3 of third page data is input to the cache latches CL1 of the first page buffers 230-1.

While the first sub-page data SPD1_PD3 is transmitted to the third data latches DL13 from the cache latches CL1, second sub-page data SPD2_PD3 of third page data is input to the cache latches CL2 of the second page buffers 230-2.

The second sub-page data SPD2_PD3 is transmitted to the data latches DL23 from the cache latches CL2. All the first data to the third data of the first and second page buffers 230-1 and 230-2 may be programmed into one selected physical page (1 Page) at a time.

The I/O circuit 230 according to example embodiments of inventive concepts performs a pipeline operation during a program operation.

Figure 9:
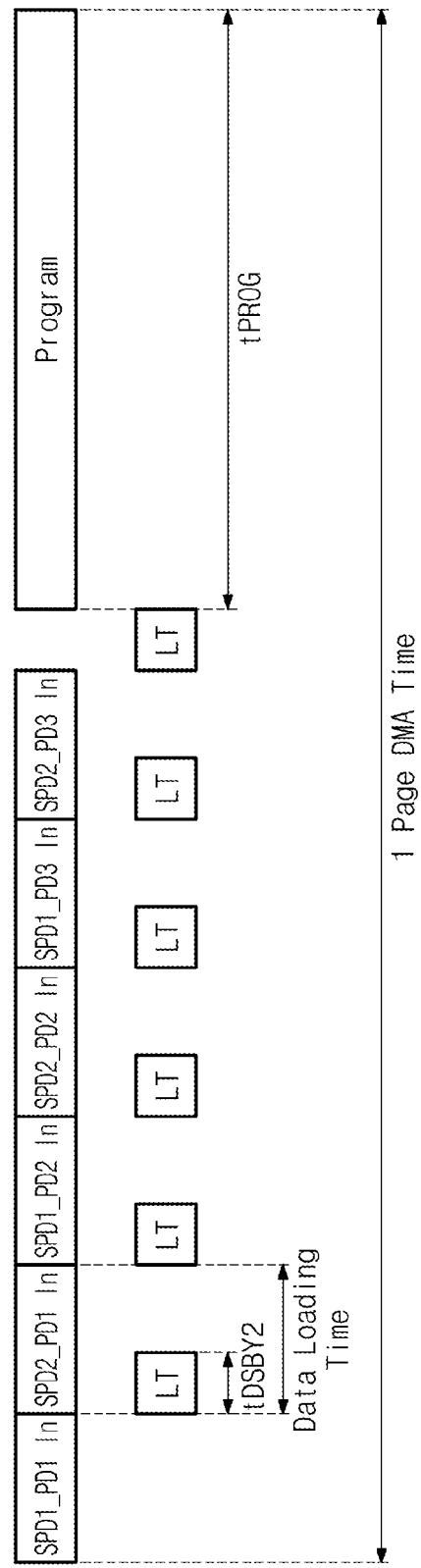
FIG. 9 is a conceptual diagram illustrating time for the program operation of an input/output circuit according to example embodiments of inventive concepts.
Figure 10:
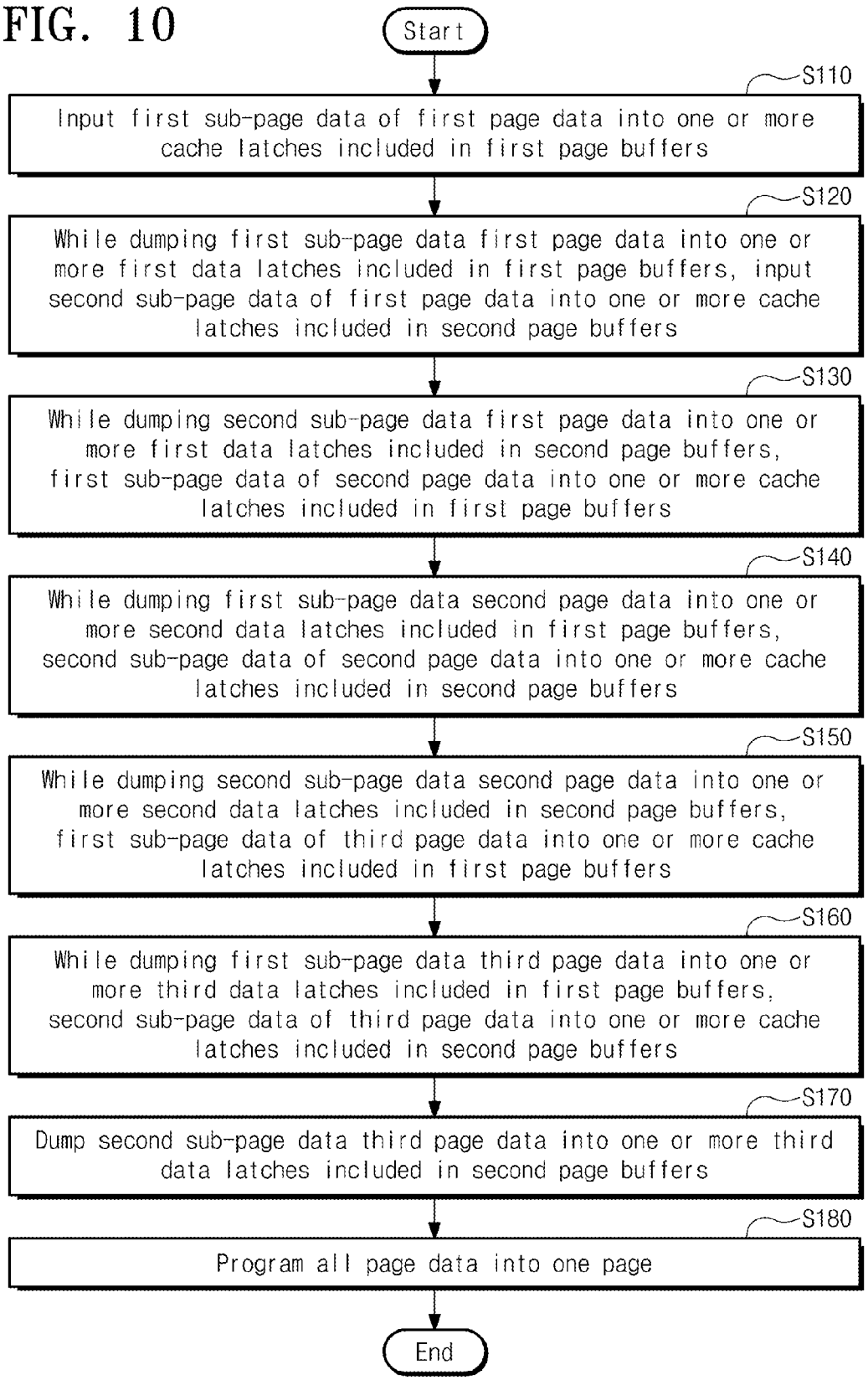
FIG. 10 is a flowchart summarizing a program operation of an input/output circuit according to example embodiments of inventive concepts.

FIG. 9 is a conceptual diagram illustrating time for the program operation of an input/output (I/O) circuit according to example embodiments of inventive concepts, and FIG. 10 is a flowchart summarizing a program operation of an input/output (I/O) circuit according to example embodiments of inventive concepts.

Referring to FIGS. 9 and 10, a non-limiting example is described where transfer operations are input operations. However, example embodiments of inventive concepts are not limited thereto.

Referring to FIGS. 9 and 10, first sub-page data SPD1_PD1 of first page data is input to cache latches CL1 of first page buffers for data loading time (S110).

After the first sub-page data SPD1_PD1 of the first page data is input to the cache latches CL1, second sub-page data SPD2_PD1 of the first page data is input to cache latches CL2 of second page buffers (S120). A dumping operation of the first sub-page data SPD1_PD1 of the first page data is performed for data loading time when the second sub-page data SPD2_PD1 of the first page data is input. The dumping operation means an operation of transmitting data to a data latch from a cache latch. Thus, for data transmission time of the second sub-page data SPD2_PD1 of the first page data, there occurs dummy busy time tDSBY2 when the first sub-page data SPD1_PD1 of the first page data is dumped into first data latches DL11 from the cache latches CL1.

After the second sub-page data SPD2_PD1 of the first page data is input to the cache latches CL2, first sub-page data SPD1_PD2 of second page data is input to the cache latches CL1 of the first page buffers (S130). For data loading time when the first sub-page data SPD1_PD2 of the second page data is input, there occurs dummy busy time tDSBY2 when the second sub-page data SPD2_PD1 of the first page data is dumped into first data latches DL21 from the cache latches CL2.

After the first sub-page data SPD1_PD2 of the second page data is input to the cache latches CL1, the second sub-page data SPD2_PD2 of the second page data is input to the cache latches CL2 of the second page buffers (S140). For data loading time when the second sub-page data SPD2_PD2 of the second page data is input, there occurs dummy busy time tDSBY2 when first sub-page data SPD1_PD2 of the second page data is dumped into the second data latches DL12 from the cache latches CL1 of the first page buffers.

After the second sub-page data SPD2_PD2 of the second page data is input to the cache latches CL2 of the second page buffers, first sub-page data SPD1_PD3 of third page data is input to the cache latches CL1 of the first page buffers (S150). For data loading time when the first sub-page data SPD1_PD3 of the third page data is input, there occurs dummy busy time tDSBY2 when the second sub-page data of the second page data is dumped into the second data latches DL22 from the cache latches CL2.

After the first sub-page data SPD1_PD3 of the third page data is input to the cache latches CL1 of the first page buffers, second sub-page data SPD2_PD3 of third page data is input to the cache latches CL2 (S160). For data loading time when the second sub-page data SPD2_PD3 of the third page data is input, there occurs dummy busy time tDSBY2 when the first sub-page data SPD1_PD3 of the third page data is dumped into the third data latches DL13 from the cache latches CL1.

Immediately after data loading time when the second sub-page data SPD2_PD3 of the third page data is input to the cache latches CL2, there occurs dummy busy time tDSBY2 when second sub-page dataSPD2_PD3 of the third page data is dumped into the third data latches DL23 from the cache latches CL2 (S170).

When the dumping operations of the first page data and second data SPD1_PD1 to SPD1_PD3 and SPD2_PD1 to SPD2_PD3 of the first page data to the third page data are completed, a program operation is performed (S180). For program operation time tPROG, the dumping operations of the first page data and second data SPD1_PD1 to SPD1_PD3 and SPD2_PD1 to SPD2_PD3 of the first page data to the third page data are programmed into one physical page (1 Page) at the same time (S180).

Referring to FIG. 9, let it be assumed that each data loading time is 15 microseconds (us) and each dummy busy time tDSBY2 is 8 us.

Referring to FIGS. 8 to 10, it can be seen that for data loading time when the first page data to the third page data SPD1_PD1 to SPD1_PD3 and SPD2_PD1 to SPD2_PD3 are input to the cache latches CL1 and CL2, there occurs dummy busy time tDSBY2 when the first page data to the third page data SPD1_PD1 to SPD1_PD3 and SPD2_PD1 to SPD2_PD3 are dumped into the first to third data latches DL11 to DL13 and DL21 to DL23. According to example embodiments of inventive concepts, since dummy busy time tDSBY2 occurs only one time, one page program time (1 Page DMA Time) is reduced.

Referring to FIGS. 8 to 10, a host is in a ready state when the first page data to the third page data SPD1_PD1 to SPD1_PD3 and SPD2_PD1 to SPD2_PD3 are input to the cache latches CL1 and CL2. In addition, the memory cell array 210 (see FIG. 2) is in a busy state when the first page data to the third page data SPD1_PD1 to SPD1_PD3 and SPD2_PD1 to SPD2_PD3 are dumped into the first to third data latches DL11 to DL13 and DL21 to DL23.

According to example embodiments of inventive concepts, the memory cell array 210 is in a busy state when a host is ready state. Thus, the host may input the first page data to the third page data SPD1_PD1 to SPD1_PD3 and SPD2_PD1 to SPD2_PD3 without being affected by the busy state of the memory cell array 210.

Figure 11:
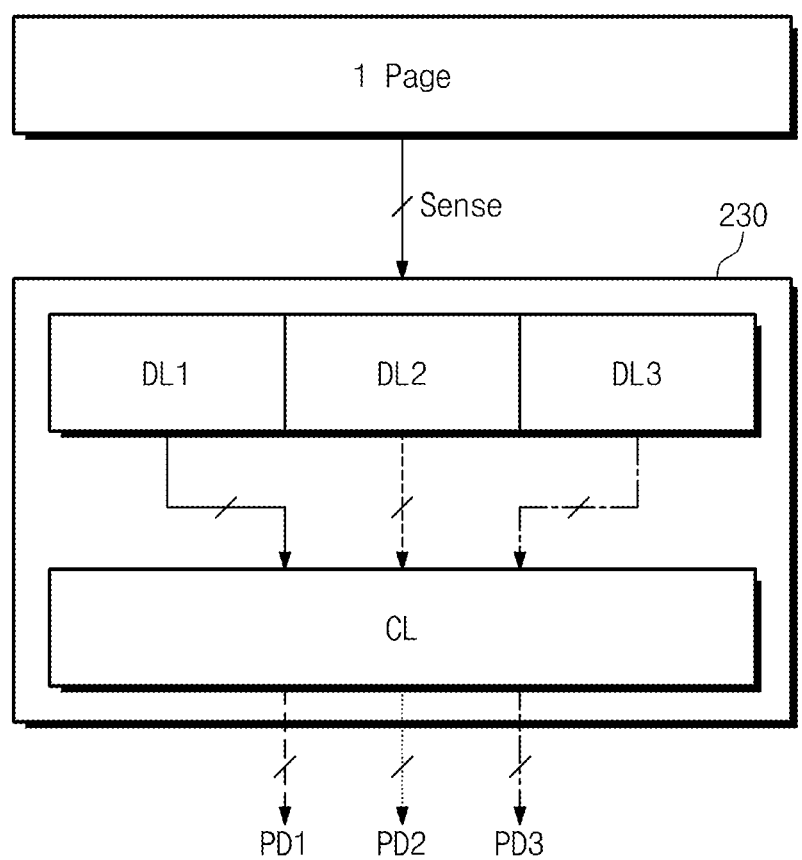
FIG. 11 is a block diagram illustrating a read operation of the input/output circuit in FIG. 10.

FIG. 11 is a block diagram illustrating a read operation of the I/O circuit 230 in FIG. 10. Referring to FIGS. 2 and 11, the I/O circuit 230 includes a plurality of page buffers PB1 to PBn. Each of the page buffers PB1 to PBn includes cache latches and data latches. FIG. 11 illustrates an example of a nonvolatile memory device according to example embodiments of inventive concepts that is includes memory cells configured as a triple-level cell (TLC). Accordingly, in FIG. 11, each of the page buffers includes at least three data latches DL1 to DL3. However, example embodiments of inventive concepts are not limited thereto. One of ordinary skill in the art would understand that the number of data latches (e.g., DL1) in each page buffer (e.g., PBn) could be adjusted depending upon the number of bits stored in each of the memory cells. However, for ease of description, a non-limiting example for a TLC memory cell is described with reference to FIG. 11.

During a read operation, the first page data to the third page data PD1 to PD3 may be simultaneously sensed from one physical page (1 Page) to be stored in the first to third data latches DL1 to DL3. The first page data PD1 may be stored in the first data latches DL1. The second page data PD2 may be stored in the second data latches DL2. The third page data PD3 may be stored in the third data latches DL3.

The first page data to the third page data PD1 to PD3 may be sequentially transmitted to the cache latches CL. The first page data PD1 is transmitted to the cache latches CL from the first data latches DL1 simultaneously to a sensing operation. After the first page data PD1 is output from the cache latches CL, the second page data PD2 is transmitted to the cache latch CL from the second data latches DL2.

After the second page data PD2 is output from the cache latches CL, the third page data PD3 is transmitted to the cache latches CL from the third data latches DL3. Finally, when the third page data PD3 is output from the cache latches CL, the read operation is completed.

Figure 12:
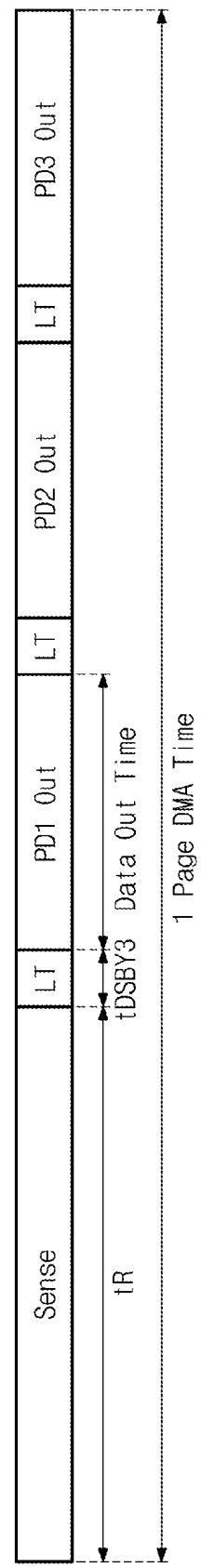
FIG. 12 is a conceptual diagram illustrating time for the read operation in FIG. 11.

FIG. 12 is a conceptual diagram illustrating time for the read operation in FIG. 11. Referring to FIGS. 11 and 12, for sensing time tR when the first page data PD1 to the third page data PD3 are sensed to the first to third data latches DL1 to DL3. The first page data PD1 may be output from the cache latches CL, which is called data output time (Data Out Time). After the first page data PD1 is output, a dumping operation is performed to transmit the second page data PD2 to the cache latches CL from the second data latches DL2, which is called dummy busy time tDSBY3.

After the second page data PD2 is output from the cache latches CL, a dumping operation is performed to transmit the third page data PD3 to the cache latches CL from the third data latches DL3. After the dumping operation, the third page data is output from the cache latches CL Referring to FIG. 12, when the first page data PD1 to the third page data PD3 are output, a host is in a ready state. When the first page data PD1 to the third page data PD3 are dumped into the cache latches CL from the first to third data latches DL1 to DL3, the memory cell array 210 (see FIG. 2) is in a busy state.

According to example embodiments of inventive concepts, the memory cell array 210 is in a ready state when the host is in the ready state. The memory cell array is in a busy state when the host is in a busy state. Thus, the host is affected by the busy state of the memory cell array 210.

Continuing to refer to FIG. 12, there are three-times data output operations two-times dumping operations. In the example corresponding to FIG. 12, let it be assumed that data output time is 30 us. Also, let it be assumed that dummy busy time is 8 us.

Continuing to refer to FIG. 12, the total time of sensing time, output time, and dummy busy time of the first page data PD1 to third page data PD3 is called one page output time (1 Page DMA Time).

Figure 13:
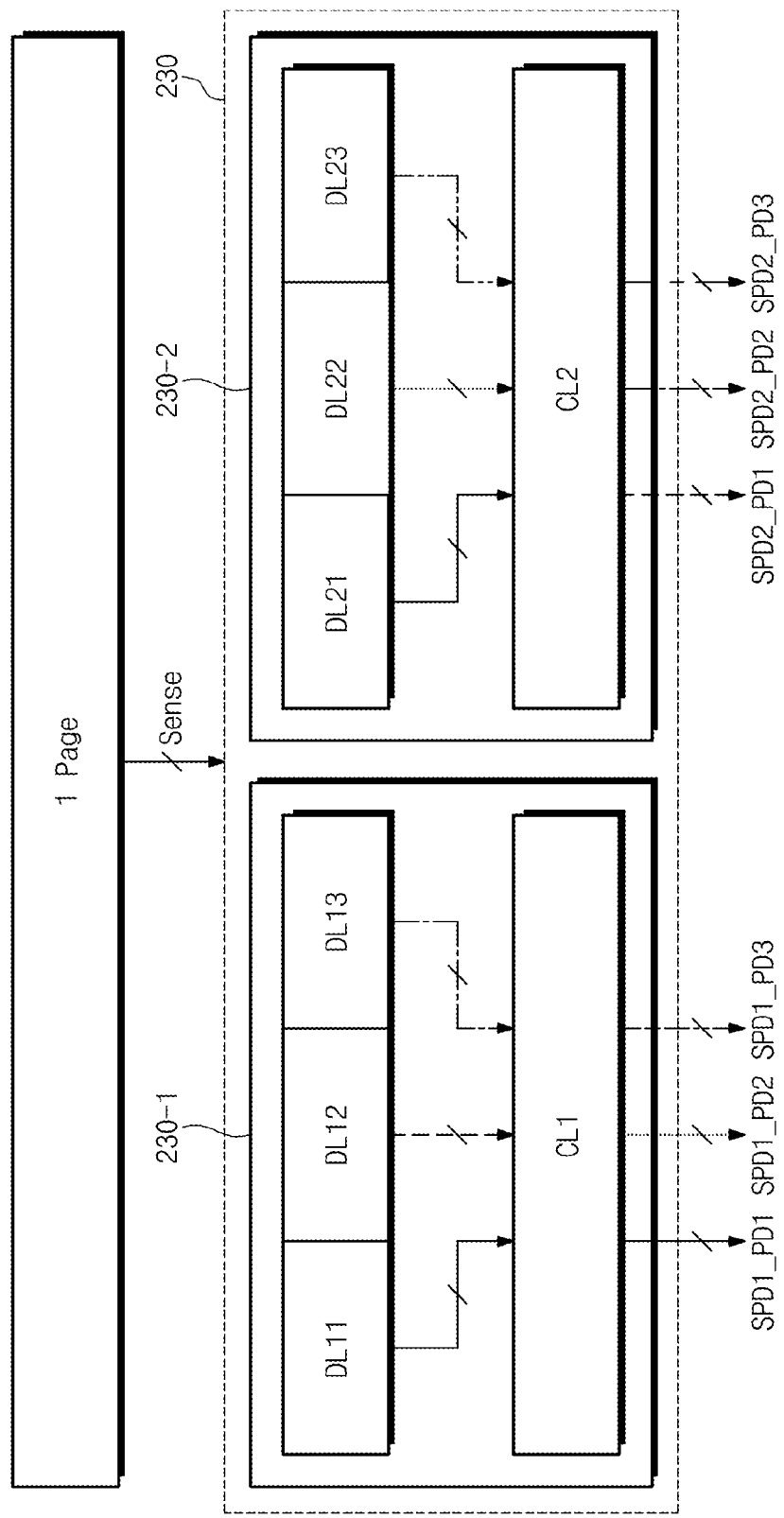
FIG. 13 is a block diagram illustrating a read operation of an input/output circuit according to example embodiments of inventive concepts.

FIG. 13 is a block diagram illustrating a read operation of an input/output (I/O) circuit 230 according to example embodiments of inventive concepts. Referring to FIG. 13, let it be assumed that page buffers of the I/O circuit 230 operate after they are divided into first page buffers 230-1 and second page buffers 230-2. The dividing operation of the first and second page buffers 230-1 and 230-2 is performed by a control signal of the control logic 240 (see FIG. 2). Similar to FIG. 11, for ease of description, FIG. 13 relates to a nonvolatile memory device according to example embodiments of inventive concepts where the number of data latches (e.g., DL11 to DL13) in each page buffer (e.g., 230-1) is determined based on corresponding to memory cells that are triple-level cells (TLC). However, example embodiments are not limited thereto.

During a read operation, page data of one physical page (1 Page) are simultaneously sensed to the I/O circuit 230. In example embodiments of inventive concepts, first sub-page data SPD1_PD1 to SPD1_PD3 of first page data to third page data are simultaneously sensed to first to third data latches DL11 to DL13 of first page buffers 230-1. The first sub-page data SPD1_PD1 of the first page data is transmitted to cache latches CL1 from the first data latches DL11 simultaneously to the sensing operation. The second sub-page data SPD2_PD1 of the first page data is transmitted to cache latches CL2 from the first data latches DL21 simultaneously to the sensing operation.

While first sub-page data SPD1_PD2 of second page data is transmitted to the cache latches CL1 from a second data latches DL12, the second sub-page data SPD2_PD1 of the first page data is output from the cache latches CL2.

While second sub-page data SPD2_PD2 of the second page data is transmitted to the cache latches CL2 from a second data latches DL22, the first sub-page data SPD1_PD2 of the second page dada is output from the cache latches CL1.

While first sub-page data SPD1_PD3 of third page data is transmitted to the cache latches CL1 from the third data latches DL13, second sub-page data SPD2_PD2 of the second page data is output from the cache latches CL2.

While second sub-page data SPD2_PD3 of third page data is transmitted to the cache latches CL2 from third data latches DL23, first sub-page data SPD1_PD3 of the third page data is output from the cache latches CL1.

Finally, when second sub-page data SPD2_PD3 of the third page data is output from the cache latches CL2, the read operation is completed.

The I/O circuit 230 performs a pipeline operation during the read operation.

Figure 14:
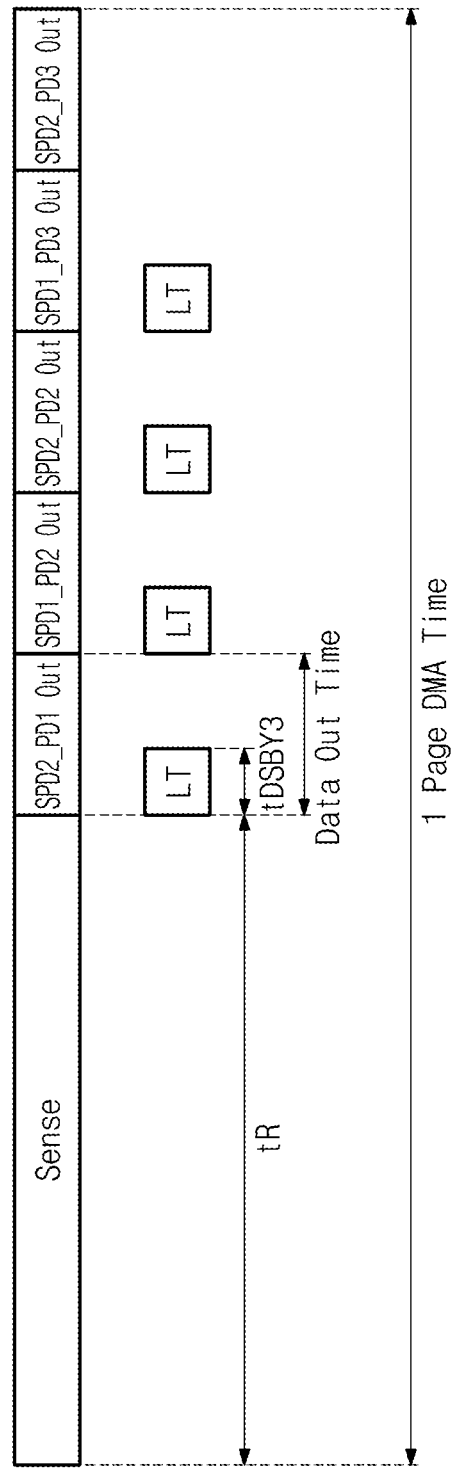
FIG. 14 is a conceptual diagram illustrating time for a read operation according to example embodiments of inventive concepts.
Figure 15:
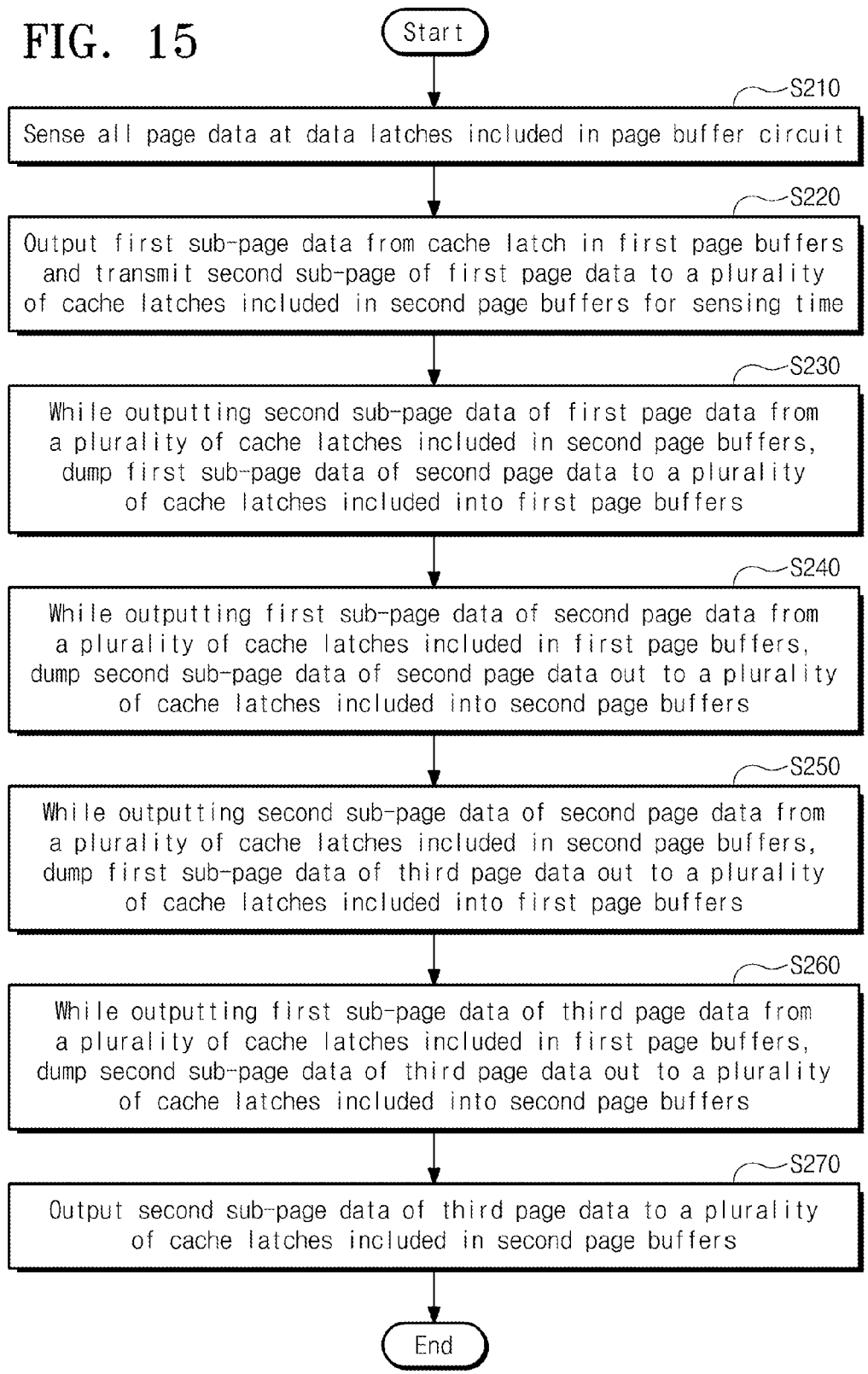
FIG. 15 is a flowchart summarizing a read operation according to example embodiments of inventive concepts.

FIG. 14 is a conceptual diagram illustrating time for a read operation according to example embodiments of inventive concepts, and FIG. 15 is a flowchart summarizing a read operation according to example embodiments of inventive concepts.

Referring to FIGS. 14 to 15, a non-limiting example is described where transfer operations are output operations. However, example embodiments of inventive concepts are not limited thereto.

Referring to FIGS. 13, 14 and 15, first sub-page data SPD1_PD1 to SPD1_PD3 of first page data to third page data are sensed to first to third page latches DL11 to DL13 of first page buffers for sensing time tR (S210). Second sub-page data SPD2_PD1 to SPD2_PD3 of the first page data to the third page data are sensed to first to third data latches DL21 to DL23 of second page buffers.

The first sub-page data SPD1_PD1 of the first page data is transmitted to cache latches CL1 from the first data latches DL11 for the sensing time tR (S220). The first sub-page data SPD1_PD1 of the first page data is output from the cache latches CL1. The second sub-page data SPD2_PD1 of the first page data is transmitted to the cache latches CL1 from the first data latches DL1 for the sensing time tR.

After the sensing operation, the second sub-page data SPD2_PD1 of the first page data is output from the cache latches CL2 (S230). For output time of the second sub-page data SPD2_PD1 of the first page data, dummy busy time tDSBY3 occurs due to a dumping operation performed to transmit the first sub-page data SPD1_PD2 of the second page data to the cache latches CL1 from the data latches DL12.

After the output operation of the second sub-page data SPD2_PD1 of the first page data, the first sub-page data SPD1_PD2 of the second page data is output from the cache latches CL1 (S240). For output time of the first sub-page data SPD1_PD2 of the second page data, dummy busy time tDSBY3 occurs due to a dumping operation performed to transmit the second sub-page data SPD2_PD2 of the second page data to the cache latches CL2 from the data latches DL22.

After the output operation of the first sub-page data SPD1_PD2 of the second page data, the second sub-page data SPD2_PD2 of the second page data is output (S250). For the output operation time of the second sub-page data SPD2_PD2 of the second page data, dummy busy time tDSBY3 occurs due to a dumping operation performed to transmit the first sub-page data SPD1_PD3 of the third page data to the cache latches CL1 from the data latches DL13.

After the second sub-page data SPD2_PD2 of the second page data is output, the first sub-page data SPD1_PD3 of the third page data is output from the cache latches CL1 (S260). For output time of the first sub-page data SPD1_PD3 of the third page data, dummy busy time tDSBY3 occurs due to a dumping operation performed to transmit the second sub-page data SPD2_PD2 of the second page to the cache latches CL2 from the data latches DL23.

After the first sub-page data SPD1_PD3 of the third page data is output, the second sub-page data SPD2_PD3 of the third page data is output from the cache latches CL2 (S270).

Referring to FIG. 13, let it be assumed that each data output time is 15 microseconds (us). In addition, let it be assumed that each dummy busy time tDSBY3 is 8 us.

Referring to FIGS. 13 to 15, dummy busy time occurs for data output time. Thus, since there is no dummy busy time tDSBY3, one page output time (1 Page DMA Time) is reduced.

Referring to FIGS. 13 to 15, when the first page data to the third page data SPD1_PD1 to SPD1_PD3 and SPD2_PD1 to SPD2_PD3 are output, the host is in a ready state. When the first page data to the third page data SPD1_PD1 to SPD1_PD3 and SPD2_PD1 to SPD2_PD3 are dumped into the cache latches CL1 and CL2 from the first to third data latches DL11 to DL13 and DL21 to DL23, the memory cell array 210 (see FIG. 2) is in a busy state.

According to example embodiments of inventive concepts, the memory cell array 210 is in a busy state when the host is in a ready state. Thus, the host may output the first page data to the third page data SPD1_PD1 to SPD1_PD3 and SPD2_PD1 to SPD2_PD3 without being affected by the busy state of the memory cell array 210.

Figure 16:
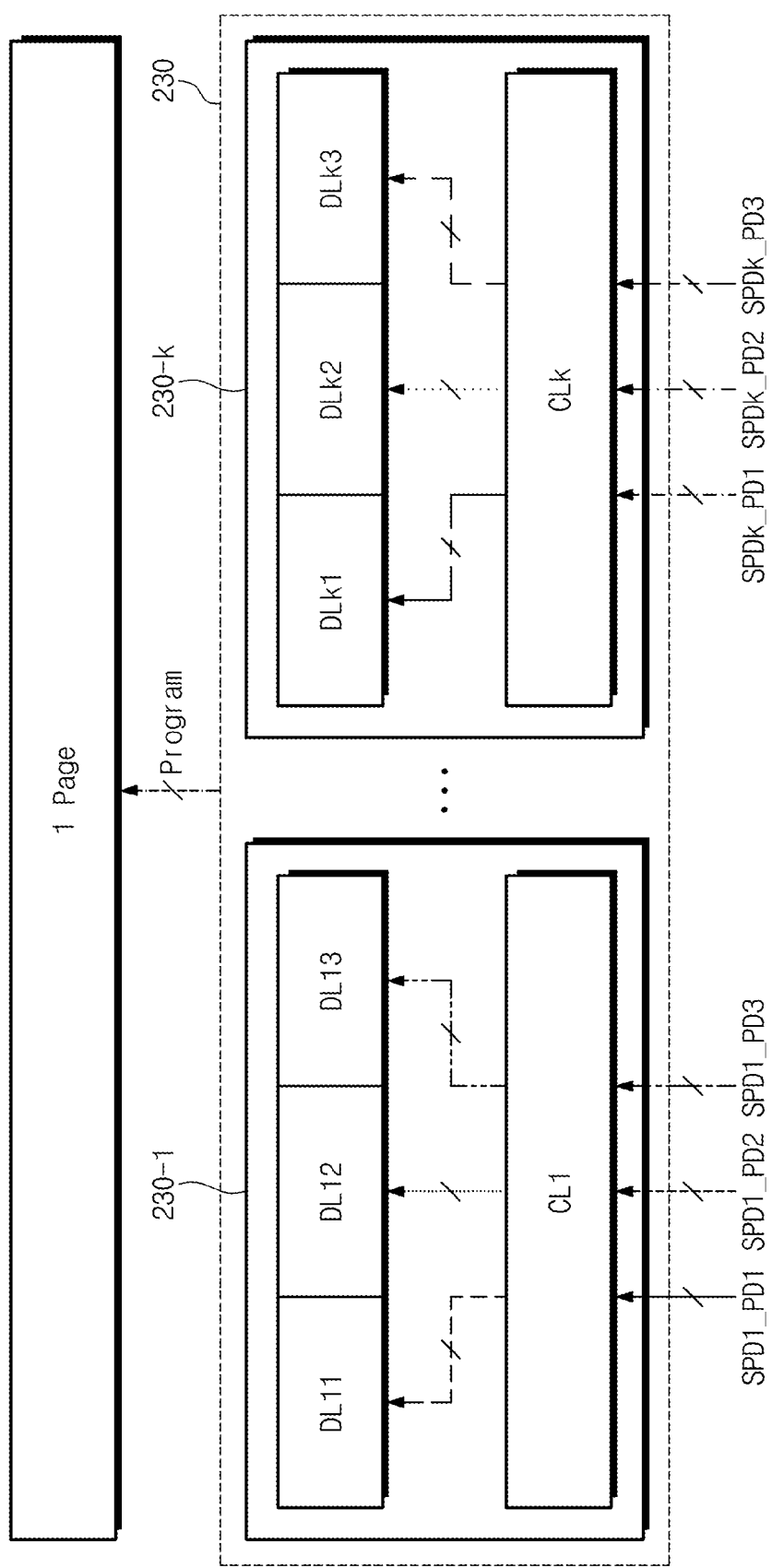
FIG. 16 is a block diagram illustrating a program operation of an input/output circuit according to example embodiments of inventive concepts.

FIG. 16 is a block diagram illustrating a program operation of an input/output (I/O) circuit 230 according to example embodiments of inventive concepts. Referring to FIG. 16, page buffers of the I/O circuit 230 operate after being divided into a plurality of groups. The I/O circuit 230 includes a plurality of page buffers 230-1 to 230-k.

The page buffers 230-1 to 230-k operate after being divided sequentially. Thus, a dumping operation of first page data to third page data SPD1_PD1 to SPD1_PD3, . . . , and SPDk_PD1 to SPDk_PD3 of the page buffers 230-1 to 230-k may occur while first to third page data SPD1_PD1 to SPD1_PD3, . . . , and SPDk_PD1 to SPDk_PD3 of the page buffers 230-1 to 230-k are output.

Figure 17:
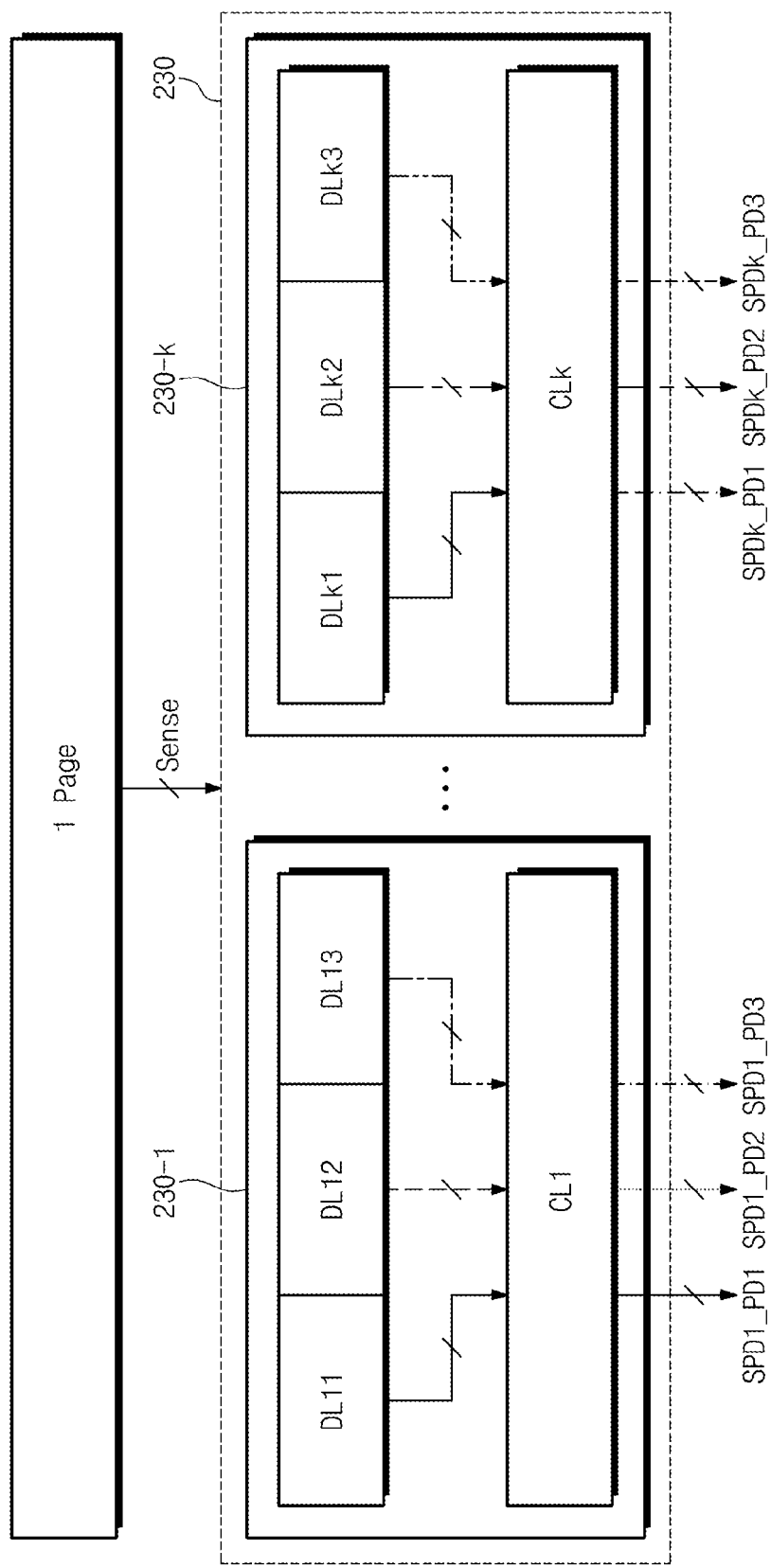
FIG. 17 is a block diagram illustrating a reading method of a plurality of pages of data according to example embodiments of inventive concepts.

FIG. 17 is a block diagram illustrating a reading method of a plurality of pages of data according to example embodiments of inventive concepts. Referring to FIG. 17, page buffers of an input/output (I/O) circuit 230 operate after being divided into a plurality of groups. The I/O circuit 230 includes a plurality of page buffers 230-1 to 230-k.

Continuing to refer to FIG. 17, a sensing operation of page data of one physical page (1 Page) occurs for sensing time. Page data SPD1_PD1 to SPD1_PD3, . . . , and SPDk_PD1 to SPDk_PD3 are stored in data latches DL11~DL13, . . . , and DLk1~DLk3 included a plurality of page buffers, respectively.

A dumping operation of the first page data SPD1_PD1 to SPDk_PD1 of the page buffers occurs for the sensing time. At the same time, first sub-page data SPD1_PD1 of the first page data is output.

When the sensing operation is completed, a dumping operation may occurs while the second page data and the third page data SPD1_PD2, SPD1_PD3, . . . , SPDk_PD2, and SPDk_PD3 are output.

Figure 18:
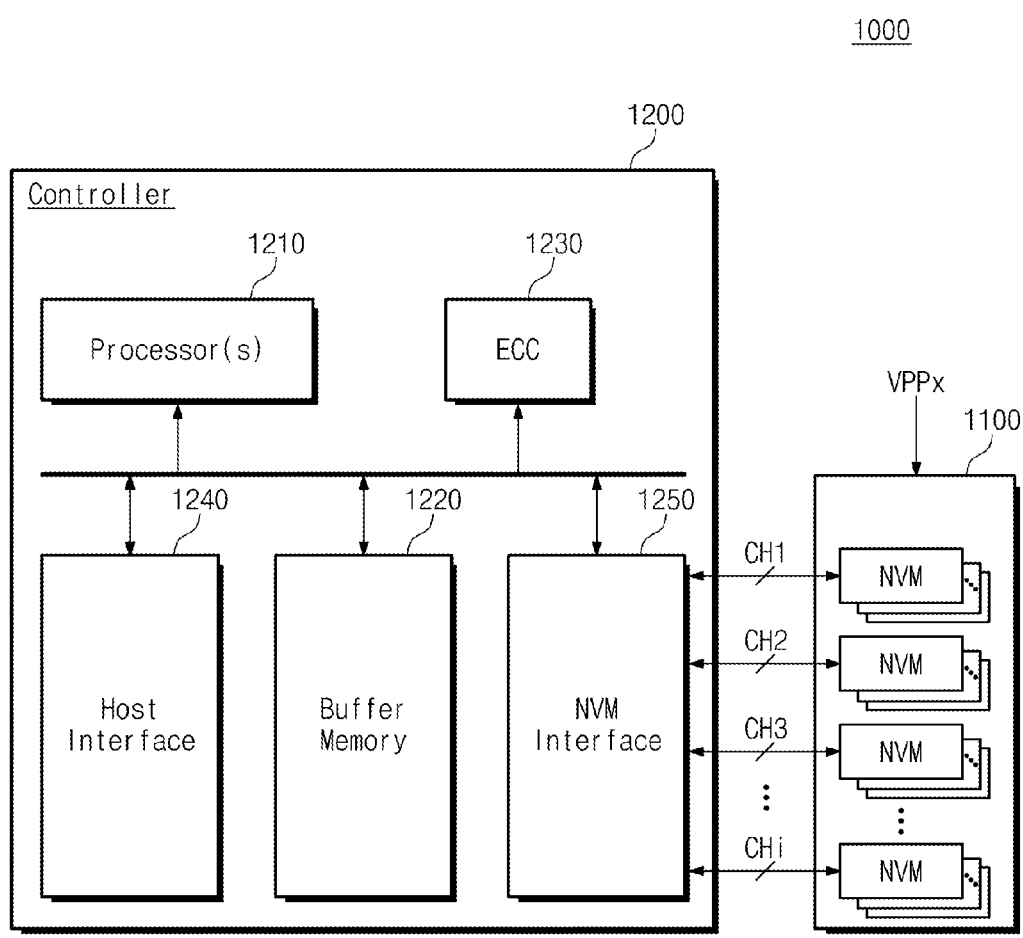
FIG. 18 is a block diagram of a solid state drive (SSD) according to example embodiments of inventive concepts.

FIG. 18 illustrates a solid state drive (SSD) 1000 according to example embodiments of inventive concepts. As illustrated, the SSD 1000 includes a nonvolatile memory device 1100 including a plurality of nonvolatile memories and a controller 1200. The nonvolatile memory device 1100 may receive a high voltage Vpp.

The controller 1200 is connected to the nonvolatile memory device 1100 vias a plurality of channels CH1 to CHi (i being an integer equal to or greater than 2). The controller 1200 includes at least one processor 1210, a buffer memory 1220, an error correction code (ECC) circuit 1230, a host interface 1240, and a nonvolatile memory interface 1250. The controller 1200 determines whether an MSB page program operation is performed on at least one memory block.

The buffer memory 1220 may temporarily store data required to drive the memory controller 1200. The buffer memory 1220 may store an error rate table (ERT) depending on operation conditions. In some embodiments, the buffer memory 1220 may include a plurality of memory lines to store data or a command.

The buffer memory 1220 may buffer data to be used in a fine program operation during a write request. In FIG. 18, the buffer memory 1220 is disposed inside the controller 1200. However, example embodiments of inventive concepts are not limited thereto. The buffer memory 1220 may be disposed outside the controller 1200.

The ECC circuit 1230 may calculate an ECC value of data to be programmed during a write operation, correct an error of data read during a read operation based on the ECC value, and correct an error of recovered data from the nonvolatile memory device 1100 during a data recovery operation.

The host interface 1240 may provide interfacing with an external device. The nonvolatile memory interface 1250 may provide interfacing with the nonvolatile memory device 1100.

Figure 19:
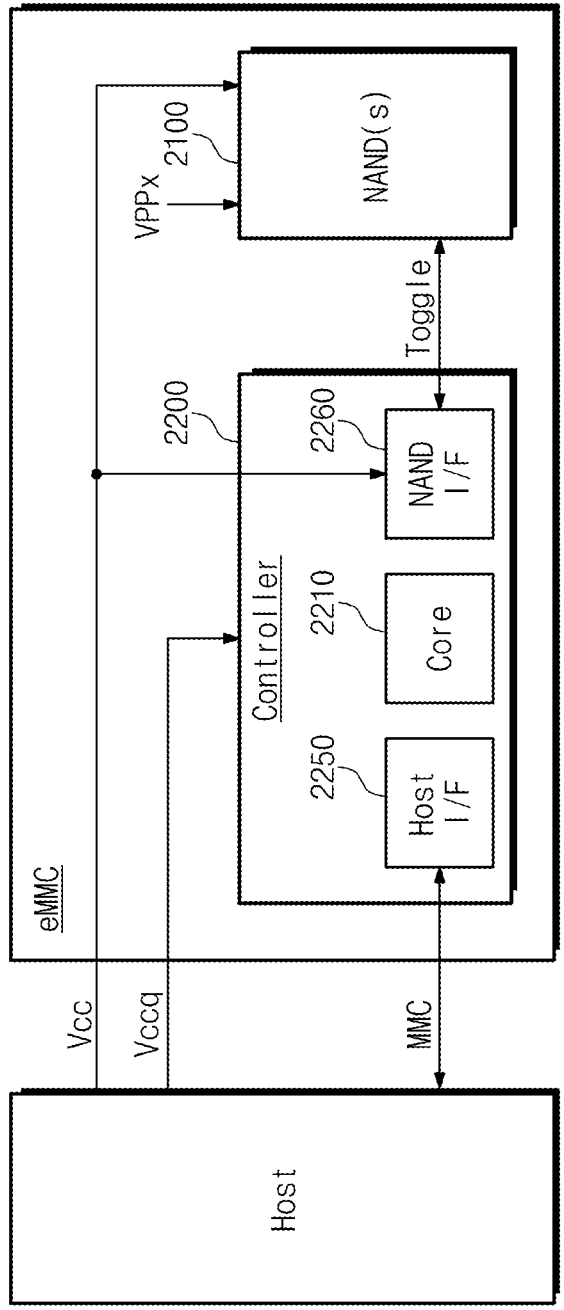
FIG. 19 is a block diagram of an embedded multimedia card according to example embodiments of inventive concepts.

Inventive concepts may be applied to an embedded multimedia card (eMMC). FIG. 19 illustrates an eMMC 2000 according to example embodiments of inventive concepts. As illustrated, the eMMC 2000 may include at least one NAND flash memory device 2100 and a controller 2200.

The controller 2200 is connected to the NAND flash memory device 2100 through a plurality of channels. The controller 2200 may include at least one controller core 2210, a host interface 2250, and a NAND interface 2260. The at least one control core 2210 controls the overall operation of the eMMC 2000. The host interface 2250 may provide host interfacing with the controller 2200. The NAND interface 2260 may provide interfacing between the NAND flash memory device 2100 and the controller 2200.

In some embodiments, the host interface 2250 may be a parallel interface (e.g., MMC interface). In other embodiments, the host interface 2250 of the eMMC 2000 may be a serial interface (e.g., UHS-II or UFS interface).

The eMMC 2000 receives first and second power supply voltages Vcc and Vccq from a host. The first power supply voltage Vcc is supplied to the NAND flash memory device 2100 and the NAND interface 2260, and the second power supply voltage Vccq is supplied to the controller 2200.

Figure 20:
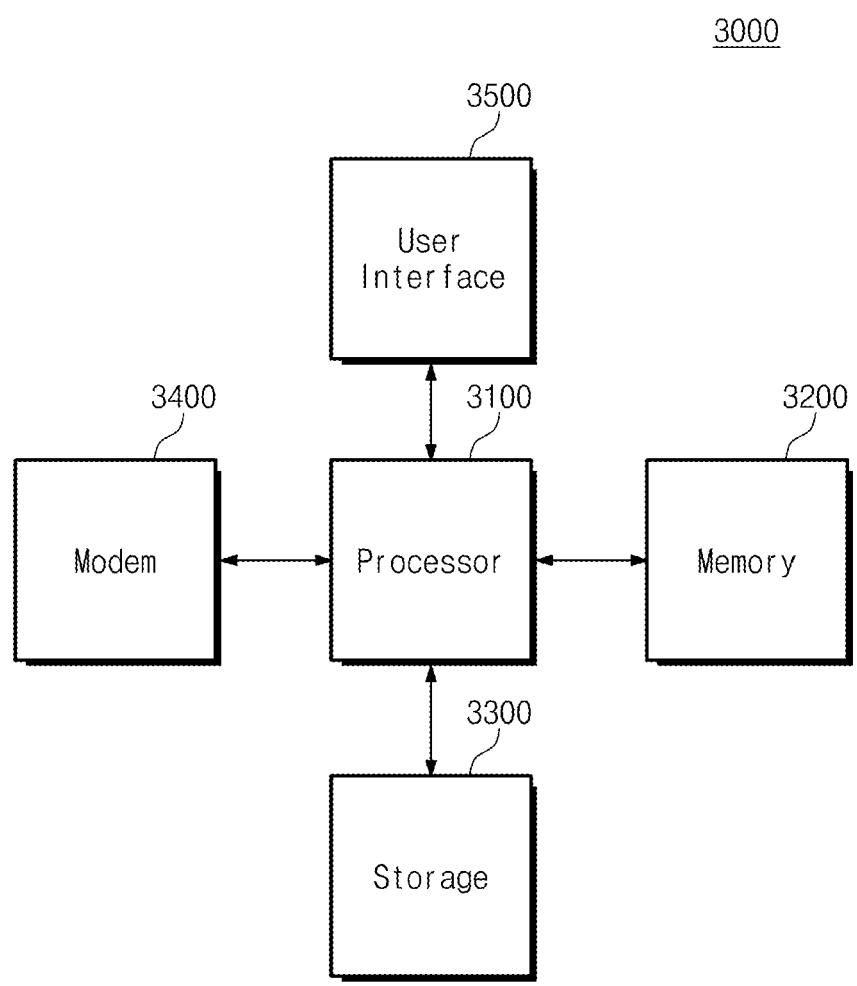
FIG. 20 is a block diagram of a computing device according to example embodiments of inventive concepts.

FIG. 20 is a block diagram of a computing device 3000 according to example embodiments of inventive concepts. As illustrated, the computing device 3000 may include a processor 3100, a memory 3200, a storage 3300, a modem 3400, and a user interface 3500. The processor 3100 may control the overall operation of the computing device 3000 and perform a logic operation. For example, the processor 3100 may be a universal processor or an application processor.

The memory 3200 may communicate with the processor 3100. The memory 3200 may be a working memory of the processor 3100 or the computing device 3000. The memory 3200 may include a volatile memory such as static RAM (SRAM), dynamic RAM (DRAM), and synchronous DRAM (SDRAM) or a nonvolatile memory such as phase-change RAM (PRAM), magnetic RAM (MRAM), resistive RAM (RRAM), and ferroelectric RAM (FRAM).

The storage 3300 may store data that the computing device 3000 desires to stores for a long period. The storage 3300 may include a hard disk drive (HDD) or a nonvolatile memory device such as flash memory, phase-change RAM (PRAM), magnetic RAM (MRAM), resistive RAM (RRAM), and ferroelectric RAM (FRAM).

The storage 3300 may be the nonvolatile memory device described with reference to FIGS. 1 to 17. As described with reference to FIGS. 1 to 17, the storage 3300 may program an LSB page of a partial block formed by an SPO to (limit and/or prevent) leakage current that may be applied through bitlines.

In some embodiments, the memory 3200 and the storage 3300 may include the same type of nonvolatile memory devices. In this case, the memory 3200 and the storage 3300 may include a single semiconductor integrated circuit.

The modem 3400 may be configured to communicate with an external device according to the control of the processor 3100. For example, the modem 3400 may perform wired or wireless communications with an external device. The modem 3400 may perform communications based on at least one of wireless communication techniques or protocols such as LTE (Long Term Evolution), WiMax, GSM (Global System for Mobile communication), CDMA (Code Division Multiple Access), Bluetooth, NFC (Near Field Communication), WiFi, and RFID (Radio Frequency Identification) or wired communication techniques or protocols such as USB (Universal Serial Bus), SATA (Serial AT Attachment), SCSI (Small Computer Small Interface), Firewire, and PCI (Peripheral Component Interconnection).

The user interface 3500 may communicate with a user according to the control of the processor 3100. For example, the user interface device 3500 may include user input interfaces such as a keyboard, a keypad, a button, a touch panel, a touch screen, a touch ball, a touch pad, a camera, a gyroscope sensor, and a vibration sensor. The user interface device 3500 may include user output interfaces such as an liquid crystal display (LCD), an organic light emitting diode (OLED) display, an active matrix OLED (AMOLED) display, an LED, a speaker, and a motor.

According to the example embodiments of inventive concepts, there may be provided a nonvolatile memory device that reduces a program or read operation time and an operating method of the nonvolatile memory device.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments.

While some example embodiments have been particularly shown and described, it will be understood by one of ordinary skill in the art that variations in form and detail may be made therein without departing from the spirit and scope of the claims. It will be understood by those of ordinary skill in the art that various changes and variations in form and details may be made therein without departing from the spirit and scope of inventive concepts as defined by the following claims.

What is claimed is:

1. An operating method of a nonvolatile memory device including first page buffers and second page buffers connected to a mat through a plurality of bitlines, the operating method comprising:
performing a first input operation that includes externally inputting first sub-page data of first page data to a first cache latch of at least one of the first page buffers;
performing a second input operation that includes inputting second sub-page data of the first page data to a second cache latch of at least one of the second page buffers after performing the first input operation; and
performing a first dumping operation that includes transmitting the first sub-page data of the first page data from the first cache latch of the at least one of the first page buffers to a first data latch of the at least one of the first page buffers during the second input operation.

2. The operating method as set forth in claim 1, further comprising:
performing a third input operation that includes inputting first sub-page data of second page data to the first cache latch of the at least one of the first page buffers after performing the second input operation;
performing a second dumping operation that includes transmitting the second sub-page data of the first page data from the second cache latch of the at least one of the second page buffers to a second data latch of the at least of the second page buffers during the third input operation;
performing a fourth input operation that includes inputting second sub-page data of the second page data to the second cache latch of the at least one of the second page buffers after performing the third input operation; and
performing a third dumping operation that includes transmitting the first sub-page data of the second page data from the first cache latch of the at least one of the first page buffers to a third data latch of the at least one of the first page buffers during the fourth input operation.

3. The operating method as set forth in claim 2, further comprising:
performing a fifth input operation that includes inputting first sub-page data of third page data to the first cache latch of the at least one of the first page buffers after performing the fourth input operation;
performing a fourth dumping operation that includes transmitting the second sub-page data of the second page data from the second cache latch of the at least one of the second page buffers during the fifth input operation;
performing a sixth input operation that includes inputting second sub-page data of the third page data to the second cache latch of the at least one of the second page buffers after performing the fifth input operation; and
performing a fifth dumping operation that includes transmitting the first sub-page data of the third page data from the first cache latch of the at least one of the first page buffers to a fifth data latch of the at least one of the first page buffers during the sixth input operation.

4. The operating method as set forth in claim 3, further comprising:
performing a sixth dumping operation that includes transmitting the second sub-page data of the third page data from the second cache latch of the at least one of the second page buffers to a sixth data latch of the at least one of the second page buffers after performing the sixth input operation.

5. The operating method as set forth in claim 4, further comprising:
programming the first and second sub-page data of the first, second, third, fourth, fifth, and sixth data latch into a single physical page of a memory cell array after completing the sixth dumping operation.

6. An operating method of a nonvolatile memory device including first page buffers and second page buffers connected to a mat through a plurality of bitlines, the operating method comprising:
performing a sensing operation that includes sensing data included in a single physical page into a first data latch of at least one of the first page buffers, a second data latch of the at least one of the second page buffers, a third data latch of at least one of the first page buffers and a fourth data latch of the at least one of the second page buffers, the data including first page data and second page data, the first data latch including first sub-page data of the first page data, the second data latch including second sub-page data of the first page data, the third data latch including first sub-page data of the second page data, and the fourth data latch including second sub-page of the second page data;

performing a first dumping operation that includes transmitting the first sub-page data of the first page data from the first data latch to a first cache latch of the at least one of the first page buffers and a first output operation that includes outputting the first sub-page data of the first page data from the first cache latch of the at least one of the first page buffers during the sensing operation;

performing a second dumping operation that includes transmitting the second sub-page data of the first page data from the second data latch to a second cache latch of the at least one of the second page buffers during the first output operation;

performing a second output operation that includes outputting the second sub-page data of the first page data from the second cache latch of the at least one of the second page buffers after performing the first output operation; and performing a third dumping operation that includes transmitting the first sub-page data of the second page data from the third data latch to the first cache latch of the at least one of the first page buffers during the second output operation.

7. The operating method as set forth in claim 6, further comprising:

performing a third output operation that includes outputting the first sub-page data of the second page data from the first cache latch of the at least one of the first page buffers after performing the second output operation;

performing a fourth dumping operation that includes transmitting the second sub-page data of the second page data from the fourth data latch to the second cache latch of the at least one of the second page buffers during the third output operation; and performing a fourth output operation that includes outputting the second sub-page data of the second page data from the second cache latch of the at least one of the second page buffers after performing the third output operation.

8. The operating method as set forth in claim 7, wherein the data further includes third page data, a fifth data latch of the at least one of the first page buffers include first sub-page data of the third page data and a sixth data latch of the at least one of the second page buffers include second sub-page data of the third page data, the operating method further includes:

performing a fifth dumping operation that includes transmitting the first sub-page data of the third page from the fifth data latch to the first cache latch of the at least one of the first page buffers during the fourth output operation;

performing a fifth output operation that includes outputting the first sub-page data of the third page data from the first cache latch of the at least one of the first page buffers after performing the fourth output operation;

performing a sixth dumping operation that includes transmitting the second sub-page data of the third page data from the sixth data latch to the second cache latch of the at least one of the second page buffers during the fifth output operation; and performing a sixth output operation that includes outputting the second sub-page data of the third page data from the second cache latch of the at least one of the second page buffers after the fifth output operation.

\* \* \* \* \*